United States Patent
Piette et al.

(10) Patent No.: US 12,282,054 B2
(45) Date of Patent: Apr. 22, 2025

(54) SYSTEM FOR CHARACTERIZING A TRANSISTOR CIRCUIT

(71) Applicant: Melexis Technologies NV, Tessenderlo (BE)

(72) Inventors: Francois Piette, Tessenderlo (BE); Cliff De Locht, Tessenderlo (BE); Axel Fanget, Bevaix (CH); Andreas Ott, Erfurt (DE); Andreas Laute, Erfurt (DE); Thomas Freitag, Erfurt (DE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 0 days.

(21) Appl. No.: 18/500,249

(22) Filed: Nov. 2, 2023

(65) Prior Publication Data

US 2024/0159820 A1 May 16, 2024

(30) Foreign Application Priority Data

Nov. 10, 2022 (EP) .................................... 22206710
Apr. 14, 2023 (EP) .................................... 23168026

(51) Int. Cl.
*G01R 31/28* (2006.01)

(52) U.S. Cl.
CPC ....... *G01R 31/2837* (2013.01); *G01R 31/287* (2013.01)

(58) Field of Classification Search
CPC .............. G01R 31/2837; G01R 31/287; G01R 31/2831; G01R 31/2836; G01R 31/2621; G11C 29/12005; H01L 29/78684
See application file for complete search history.

(56) References Cited

U.S. PATENT DOCUMENTS 5,039,941 A    8/1991   Castro
5,194,802 A * 3/1993   Hill .......................... G05F 1/563
                                                    323/280

(Continued)

FOREIGN PATENT DOCUMENTS

CN      115032515 A    9/2022

OTHER PUBLICATIONS

Mackin, Charles, "Graphene Chemical and Biological Sensors: Modeling, Systems, and Applications", PhD Thesis at the Massachusetts Institute of Technology, Jun. 18, 2018, pp. 1-199.

(Continued)

*Primary Examiner* — Son T Le
*Assistant Examiner* — Brian Butler Geiss
(74) *Attorney, Agent, or Firm* — Workman Nydegger

(57) ABSTRACT

A system for characterizing a transistor circuit which has a local minimum in its transfer characteristic by finding its local minimum. The system comprises: a bias voltage generator for generating a toggling signal; a multiplier configured for multiplying an electrical signal which is a function of the drain source current of the transistor circuit, with a waveform alternating between two predefined values synchronously with the toggling signal; a first integrator configured for integrating the electrical signal from the multiplier, and wherein if more integrators are present, linear combinations of output signals of the integrators are provided to the further integrators; a summator configured for summing the toggling signal and an integration signal and configured for outputting the sum to the gate of the transistor circuit.

15 Claims, 13 Drawing Sheets

(56) References Cited

U.S. PATENT DOCUMENTS 8,638,163 B2 1/2014 Kim et al.
2013/0069714 A1 3/2013 Kim et al.

OTHER PUBLICATIONS

Extended European Search Report from Corresponding European Patent Application No. EP22206710.0, May 9, 2023.
Extended European Search Report from Corresponding European Patent Application No. EP23168026.5, Sep. 11, 2023.

* cited by examiner

SYSTEM FOR CHARACTERIZING A TRANSISTOR CIRCUIT

FIELD OF THE INVENTION

The invention relates to the field of transistor circuits which have a transfer characteristic with a local minimum. More specifically it relates to a system for finding the local minimum of the transfer characteristic of such a transistor circuit.

BACKGROUND OF THE INVENTION

Finding the local minimum of a transistor circuit which has a transfer characteristic with a local minimum may be achieved by sweeping the gate source voltage and measuring the source drain current through the transistor circuit. This allows to find the specific gate source voltage where the current is minimum. It would be advantageous if the time for finding this specific voltage could be reduced.

An example of such a transistor circuit is a graphene FET which has a local minimum at the Dirac voltage. U.S. Pat. No. 8,638,163B2 discloses a device and method wherein a semiconductor device is used for generating a test voltage. A graphene transistor is configured to receive a gate-source voltage based on the test voltage, and a detector is configured to detect whether the gate-source voltage is a Dirac voltage of the graphene transistor. The detector therefore detects whether the graphene transistor is turned off or not based on the drain source voltage and/or the drain source current. Also in this case if would be advantageous if the time for finding the specific voltage (in this case the Dirac voltage) could be reduced.

There is therefore a need for an alternative system for determining the local minimum of a transistor circuit which has a transfer characteristic with a local minimum.

SUMMARY OF THE INVENTION

It is an object of embodiments of the present invention to provide a system for determining the local minimum of a transistor circuit which has a transfer characteristic with a local minimum.

The above objective is accomplished by a method and device according to the present invention.

Embodiments of the present invention relate to a system for characterizing a transistor circuit.

The transistor circuit comprises a gate, a source, and a drain, and is configured such that a drain source current versus gate source voltage transfer function has a local minimum for a specific voltage.

The system is configured for measuring this specific voltage, and comprises:
the transistor circuit,
a bias voltage generator configured for generating a toggling signal, toggling between plus and minus a predefined bias voltage vG around a given bias point,
one or more integrators,
a multiplier configured for generating an electrical signal by multiplying an electrical signal which is a function of the drain source current of the transistor circuit, with a waveform alternating between two predefined values plus and minus A which alternates synchronously with the toggling signal.
A first integrator, of the one or more integrators, is configured for integrating the electrical signal from the multiplier, and if more integrators are present, linear combinations of output signals of the integrators are provided to the further integrators.

The system, moreover, comprises a summator configured for summing the toggling signal and an integration signal, or a processed version thereof, wherein the integration signal is obtained by linearly combining outputs of the one or more integrators and configured for outputting the sum to the gate of the transistor circuit.

In embodiments of the present invention the transistor circuit comprises:
a first transistor and a second transistor,
a first voltage converter configured for converting a voltage at the gate of the transistor circuit or at the source of the transistor circuit, according to a transfer function with a first slope, into a gate source voltage between the gate and the source of the first transistor,
a second voltage converter configured for converting a voltage at the gate of the transistor circuit or at the source of the transistor circuit, according to a transfer function with a second slope, into a gate source voltage between the gate and the source of the second transistor.

The first slope and the second slope have opposite signs.

If the first voltage converter is configured for converting the voltage at the source of the first transistor then the transistor circuit, furthermore, may comprise a third voltage converter. This third voltage converter is configured for applying a voltage at the drain of the first transistor such that a stable drain-source voltage is obtained for the first transistor.

If the second voltage converter is configured for converting the voltage at the source of the second transistor then the transistor circuit, furthermore, may comprise a fourth voltage converter. The fourth voltage converter is configured for applying a voltage at the drain of the second transistor such that a stable drain-source voltage is obtained for the second transistor.

In embodiments of the present invention the first transistor or the second transistor is exposable to and sensitive for a chemical component.

In embodiments of the present invention the first transistor and the second transistor are metal-oxide-semiconductor FET or bipolar transistors.

In embodiments of the present invention the transistor circuit is a graphene FET.

In embodiments of the present invention the system comprises a sample and hold circuit for sampling and holding the integration signal for obtaining the processed version of the integration signal.

In embodiments of the present invention the system comprises exactly one integrator.

In embodiments of the present invention the system comprises exactly two integrators wherein an input signal of the second integrator is the sum of an output signal of the first integrator and an output signal of the second integrator multiplied with a predefined constant $a_1$.

In embodiments of the present invention the predefined bias voltage is such that the sum obtained by the summator is inside a quadratic region of the transistor circuit characteristic.

In embodiments of the present invention the predefined bias voltage is such that the sum obtained by the summator is in a linear region of the transistor circuit characteristic.

In embodiments of the present invention, in a first stage the predefined bias voltage may be such that the sum obtained by the summator is in a linear region of the transistor circuit characteristic and in a second stage the predefined bias voltage may be such that the sum obtained by the summator is inside a quadratic region of the transistor circuit characteristic.

In embodiments of the present invention the system comprises a quantizer configured for quantizing the integrator signal at a predefined sampling frequency, and a digital to analog converter for converting the quantized signal into an analog signal for summing with the toggling signal at the summator.

In embodiments of the present invention the digital to analog converter is toggling between a first predefined reference voltage for a digital zero input and a second predefined reference voltage for a digital one input wherein the first and second reference voltages and the predefined bias voltage are selected such that toggling with the predefined bias voltage results in a voltage in the left linear region and a voltage in the right linear region of said transistor circuit.

In embodiments of the present invention the digital to analog converter is toggling between a first predefined reference voltage for a digital zero input and a second predefined reference voltage for a digital one input. The first reference voltage and the predefined bias voltage are selected such that toggling with the predefined bias voltage results in a voltage in the left part of a quadratic region and a voltage in the same left part of said quadratic region. The second reference voltage and the predefined bias voltage are selected such that toggling with the predefined bias voltage results in a voltage in the right part of said quadratic region and a voltage in the same right part of said quadratic region of said transistor circuit.

In embodiments of the present invention the quantizer is a multi-bit quantizer with a predefined number of Nq bits, wherein the digital to analog converter has $N_q$ bits.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
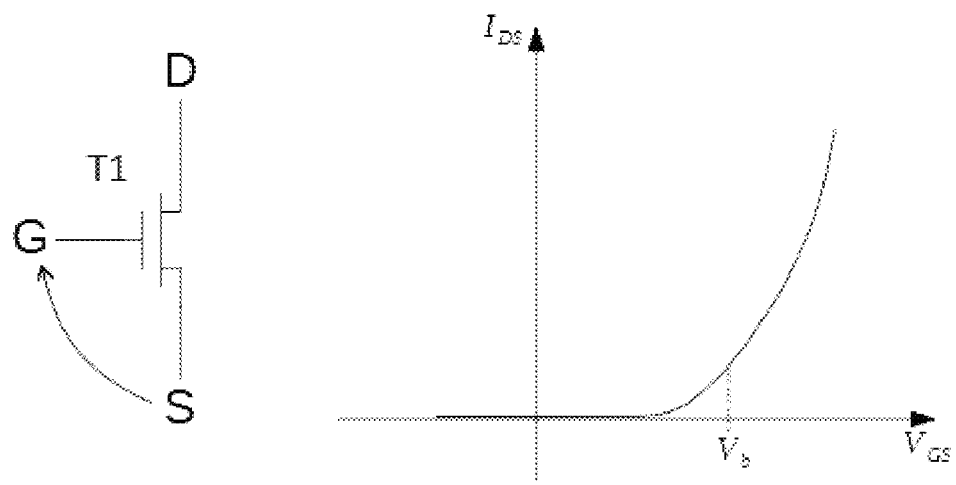
FIG. 1 shows a schematic drawing of a transistor and a graph showing the drain-source current in function of the gate voltage of the transistor.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to the quadratic region of a transistor circuit, reference is made to the region wherein the current vs. gate characteristic can be approximated by a second order curve.

Where in embodiments of the present invention reference is made to the linear region of a transistor circuit, reference is made to the region wherein the current vs. gate characteristic can be approximated by two linear functions.

Embodiments of the present invention relate to a system 100 for characterizing a transistor circuit which comprises a gate, a source, and a drain. The transistor circuit is configured such that a drain source current in function of a gate source voltage transfer function has a local minimum for a specific voltage. The system 100 is configured for measuring the specific voltage.

Exemplary embodiments of such systems 100 are shown in FIG. 5, FIG. 7, FIG. 17, and FIG. 22.

A system in accordance with embodiments of the present invention comprises:
   the transistor circuit 110,
   a bias voltage generator 120 configured for generating a toggling signal, toggling between plus and minus a predefined bias voltage $v_G$ around a given bias point,
   one or more integrators 130,
   a multiplier 140 configured for generating an electrical signal by multiplying an electrical signal which is a function of the drain source current of the transistor circuit 110, with a waveform alternating between two predefined values plus and minus A which alternates synchronously with the toggling signal, wherein a first integrator 130, of the one or more integrators 130, is configured for integrating the electrical signal from the multiplier 140, or if more integrators 130 are present, linear combinations of output signals of the integrators are provided to the further integrators 130,
   a summator 150 configured for summing the toggling signal and an integration signal, or a processed version thereof, wherein the integration signal is obtained by linearly combining outputs of the one or more integrators 130 and configured for outputting the sum as gate source voltage of the transistor circuit.

In embodiments of the present invention the gate voltage or the source voltage may be toggled in order to get a toggling of the gate source voltage corresponding with said toggling signal. When toggling the source voltage, the drain voltage might be toggled simultaneously such that the drain source voltage remains stable. Toggling the source voltage may be advantageous for a common gate operation. In such a configuration the common gates of one or more transistor circuits may be kept at a fixed potential and the feedback voltage (i.e. the sum of the toggling signal and the integration signal or a processed version thereof) may be applied to the source. A version of said feedback voltage should then also be applied to the drain simultaneously such that a stable drain source voltage is obtained. Also this is of advantage for a common gate operation. When toggling the source voltage without toggling the drain voltage, instability in the drain source voltage may be compensated for by post processing in order to remove errors due to instability in the drain source voltage.

It is an advantage of embodiments of the present invention that from the integration signal or from the processed version of the integration signal the specific voltage related to the local minimum of the transfer function of the transistor circuit can be obtained.

A system 100 according to embodiments of the present invention may comprise different types of transistor systems. The inventors have found a particular transistor circuit, in accordance with embodiments of the present invention, which may be used for detecting and/or quantifying a chemical component such as for example bio-molecules or ions. The transistor circuit may be sensitive to chemical components of different kinds (e.g. different types of bio molecules or different kinds of ions).

In the field of sensing a field effect transistor (FET) may be used with a gate electrode that is sensitive to one or more chemical components. When exposing the gate electrode to a liquid or a gas, that contains the one or more chemical components, these one or more chemical components interact with the gate electrode in a certain way, so that the FET changes its electrical characteristics as for example the drain source current Ids which is a function f of the gate source voltage $V_{GS}$ and the drain source voltage $V_{DS}$: $I_{DS}=f(V_{DS}, V_{GS})$.

The usual approach is, that an initial function of $I_{DS}=f1(V_{DS}, V_{GS})$ is either known or either measured before the transistor is exposed to the media.

After the exposure to the media and the interaction of the molecules to be detected with the gate, the relationship between $V_{DS}$, $V_{GS}$ and $I_{DS}$ is modified into $I_{DS}=f2(V_{DS}, V_{GS})$. It was observed by the inventors that in most cases f2 is shifted compared to f1.

In the classic approach the shift between f2 compared to f1 is measured and analyzed. This is time consuming and requires some complex hardware/software efforts. The left drawing of FIG. 1 shows a classic n-channel field effect transistor with gate G, source S, and drain D terminals. The right graph shows the drain source current Ids in function of the gate source voltage $V_{GS}$ ($I_{DS}=f(V_{GS})$) characteristic. At a given bias point $V_b$, a drain source current in function of the bias voltage can be derived $I_{DS}=f(V_b)$.

The inventors have found that by combining the transistors in a transistor circuit the drain source current of this transistor circuit in function of the gate source voltage has a local minimum.

Figure 2A:
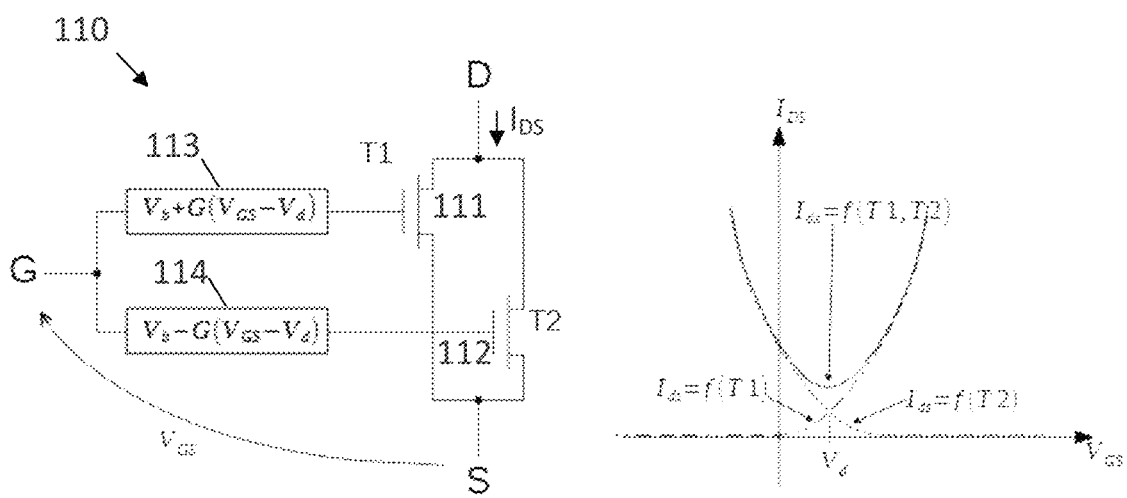
FIG. 2A shows a transistor circuit in accordance with embodiments of the present invention comprising voltage converters at the gates of the transistors.

An example thereof is illustrated in FIG. 2A. The transistor circuit 110 comprises a first transistor 111 and a second transistor 112 with shared sources forming the source of the transistor circuit 110 and with shared drains forming the drain of the transistor circuit 110. A first voltage converter 113 converts a voltage at the gate of the transistor circuit 110, according to a transfer function with a first slope, into a voltage at the gate of the first transistor 111, and a second voltage converter 114 converts a voltage at the gate of the transistor circuit 110, according to a transfer function with a second slope, into a voltage at the gate of the second transistor 112. The first slope and the second slope have opposite signs.

Figure 2B:
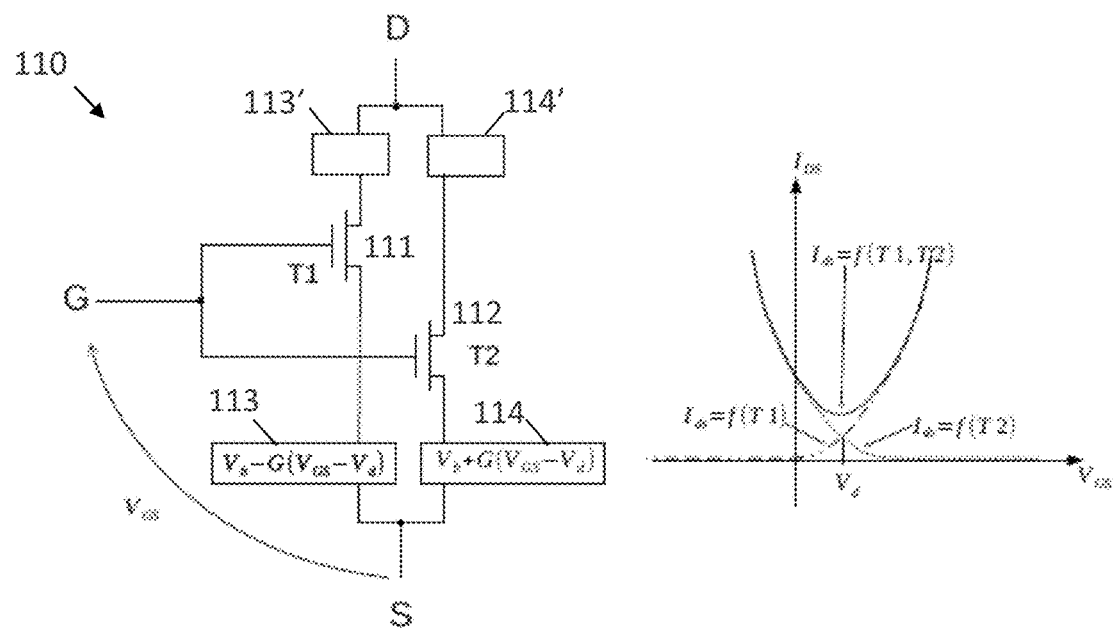
FIG. 2B shows a transistor circuit in accordance with embodiments of the present invention comprising voltage converters at the sources of the transistors and optional at the drains of the transistors.

Alternatively the first voltage converter 113 and the second voltage converter 114 may respectively be connected to the source of the first transistor 111 and the source of the second transistor 112 for creating the gate source voltage. An example thereof is illustrated in FIG. 2B. In that case, additionally, the transistor circuit may comprise a third voltage converter 113' and a fourth voltage converter 114' respectively connected with the drain of the first transistor 111 and the drain of the second transistor 112 for driving the drains with a version of the signals on the source of the first and second transistor in order to achieve a constant drain source voltage of the first transistor and a constant drain source voltage of the second transistor, so that a stable drain source current can be obtained. Also this is of advantage for a constant gate operation under consideration of the two-transistor-circuit.

Keeping the drain source voltage constant is not strictly necessary. A system in accordance with embodiments of the present invention may also work accepting some modulation of the drain source voltage. This would cause a shift in the detected minimum conduction point but in different applications this is acceptable. Users may for example be interested in the drift before and after exposure to a target chemical and the measured drift accepting drain source voltage modulation may be the same as the actual voltage drift of the specific voltage (e.g. Dirac voltage). In embodiments of the present invention the system may be configured for post processing of the found minimum to compensate for the changes in the drain source voltage.

The transistor circuit 110 of FIG. 2 may be sensitive to any type of exposure. The two transistors may be transistors of the same kind. They may for example be two n-channel transistors (as it is shown in the schematic drawing), they may for example also be two p-channel transistors, two depletion transistors, or two zero threshold voltage transistors.

The transistors may for example be characterized by a threshold voltage Vth, that can be positive, negative, or even zero.

In embodiments of the present invention the transistors have a nonlinear current versus control voltage characteristic with a quadratic term in the polynomial expansion of their I=f(V) characteristics in the neighborhood of the operating point Vb. Any transistors may be used. They could also be bipolar transistors or MOSFET transistors, which can also be used in their subthreshold (<Vth) ranges.

The first voltage converter 113 converts a voltage VGS at the gate of the transistor circuit into a voltage at the gate of the first transistor 111 using the following formula:

$$V_{GS1} = V_b + G(V_{GS} - V_d)$$

This function defines the operating point of the first transistor at the minimum conduction point (gate voltage $V_b$) occurring at the control voltage $V_{GS} = V_d$. The voltage $V_{GS1}$ applied between the gate and the source of the first transistor is increasing with the control voltage $V_{GS}$ according to a given slope (G).

The second voltage converter 114 converts a voltage VGS at the gate of the transistor circuit into a voltage at the gate of the second transistor 112 using the following formula:

$$V_{GS2} = V_b - G(V_{GS} - V_d)$$

The voltage $V_{GS2}$ applied between the gate and the source of the second transistor is decreasing with the control voltage $V_{GS}$ according to the opposite slope or gain factor (−G).

The drain source current of the first transistor is shown in FIG. 2 and is a function of the gate source voltage and is expressed as $I_{ds}=f(T1)$. Because of the first voltage converter it has a positive slope. The drain source current of the second transistor is shown in FIG. 2 and is a function of the gate source voltage and is expressed as $I_{ds}=f(T2)$. Because of the second voltage converter it has a negative slope. The traces are mirrored in the vertical direction for the nonexposed transistors as they are in their initial state.

The drain source current for both transistors together is the sum of the drain source currents of each transistor and is expressed as $I_{ds}=f(T1, T2)$. This final trace of the transistor circuit is characterized in that the current has a local minimum and the current is of a quadratic nature around that minimum.

This local minimum will be shifted to other positions than $V_d$ if the voltage current characteristic of one of the transistors is shifted. This may for example occur when the first transistor or the second transistor is exposable to and sensitive for a chemical component. When exposing the sensitive transistor to the chemical component (e.g. a biomolecule, or an ion) this will result in a shift of the transfer function and therefore also in a shift of the local minimum. It is an advantage that the specific voltage of this minimum can be measured using a system in accordance with embodiments of the present invention.

One of the transistors in FIG. 2 may be exposable to and sensitive for a chemical component while the other transistor is not exposed to the chemical component. The chemical component may be present in a given medium such as a liquid, a gel, or a gas.

In the transistor circuit illustrated in FIG. 2 the transistors may for example also be graphene transistors wherein both transistors are exposed to the medium, but only one transistor is for example functionalized to be more sensitive for a given kind of chemical components (e.g. biomolecules) and the other one is not.

Figure 3:
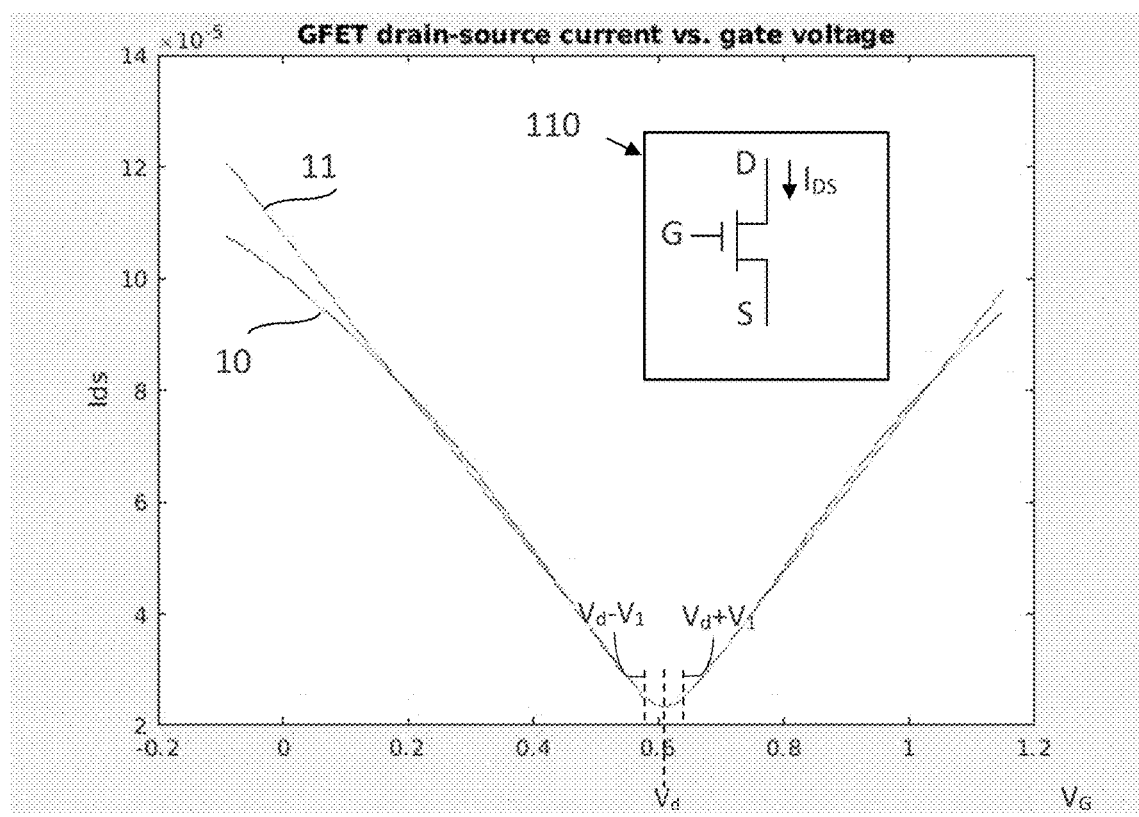
FIG. 3 shows a GFET drain-source current versus gate voltage and an approximation thereof.

In embodiments of the present invention also a single graphene field effect transistor (GFET) can be used as transistor circuit 110 (see inset in FIG. 3). The reason therefore being that a single GFET has a local minimum in its current voltage characteristic. In that case the specific gate source voltage at which the drain source current is at a local minimum is the Dirac voltage of the GFET. Using a system, in accordance with embodiments of the present invention, the GFET is integrated inside a closed loop-system acting as a low-pass filter which delivers an output voltage equal to the Dirac voltage of the GFET. The loop can be a sigma-delta modulator delivering a digital value of the Dirac voltage. In embodiments of the present invention the Dirac voltage is shifted during exposure of the GFET to a chemical component to which it is sensitive.

If in the transistor circuit illustrated in FIG. 2 two graphene transistors are used, one exposed and the other one not, or one functionalized and the other one not, this will result in an overlay of two non linear functions which both have a Dirac point and of which the combination has a common Dirac point. This common Dirac point will be shifted during exposure when the exposure changes the electrical characteristic of the exposed graphene transistor. This is not illustrated in the right graph of FIG. 2 which instead shows the current voltage characteristics of normal MOS transistors. In embodiments of the present invention with a transistor circuit as illustrated in FIG. 2, both transistors might generate a transfer function which in case of a MOS transistor can for example be approximated by a $2^{nd}$ order in the neighborhood of the minimum conduction point:

$$I_{DS}=I_1+a_1(V_{GS}-V_d)+b_1(V_{GS}-V_d)^2+I_2-a_2(V_{GS}-V_d)+b_2(V_{GS}-V_d)^2$$

$$I_{DS}=I_1+I_2+(a_1-a_2)(V_{GS}-V_d)+(b_1+b_2)(V_{GS}-V_d)^2$$

The minimum conduction point is shifted if an electrical characteristic of one of the transistors is modified. This could be $I_2$, $a_2$, and/or $b_2$ if the transistor $T_2$ is exposed.

These equations and the equations below are valid when the transistors are MOS transistors. Similar equations can be derived if two GFETs are used.

In the particular case of MOS transistors biased in strong inversion, with Vth1 and Vth2 the threshold voltages of the transistors, the following $I_{ds}=f(V_{GS})$ characteristics can be derived:

$$I_{ds}=a_1(V_{GS1}-V_{th1})^2+a_2(V_{GS2}-V_{th2})^2$$

$$I_{ds}=a_1(V_b+G(V_{GS}-V_d)-V_{th1})^2+a_2(V_b-G(V_{GS}-V_d)-V_{th2})^2$$

In embodiments of the present invention the transistor circuit may be configured such that the minimum conduction point of the system before exposure with identical matched transistors is set at gate voltage $V_{GS}=V_d=0$. Then the following equation can be derived:

$$I_{ds}=a_1(V_b+GV_{GS}-V_{th1})^2+a_2(V_b-GV_{GS}-V_{th2})^2$$

The minimum conduction point is shifted if the gain $a_2$ or the threshold $V_{th2}$ is modified, if the transistor $T_2$ would for instance be exposed to a chemical component.

The specific voltage at the minimum conduction point $V_{GSmc}$ can be obtained by calculating the first derivative of $I_{ds}$ in the equation above and equating this derivative to zero resulting in:

$$V_{GSmc} = \frac{(a_1-a_2)V_b + a_2 V_{th2} - a_1 V_{th1}}{G(a_1+a_2)}$$

A transistor circuit as shown in FIG. 2 will have a local minimum (minimum conduction point) at a specific voltage. When one of the transistors is sensitive and exposed to the chemical component the specific voltage changes.

It is an advantage that this specific voltage can be obtained using a system 100 in accordance with embodiments of the present invention which comprises this transistor circuit.

In embodiments of the present invention the transistors of the transistor circuit may be chemical sensitive transistors (CHEMFETs), or ion sensitive transistors (ISFETS), but also graphene transistors (GFETs) in a differential approach. New application fields might be supported as well, for what graphene transistors are for instance not sensitive enough, e.g. measurements at very high temperature or harsh media.

In embodiments of the present invention the first transistor or the second transistor is exposable to and sensitive for a chemical component. In embodiments of the present invention only one of the transistors is exposable and this one is sensitive to the chemical component.

In embodiments of the present invention the first transistor and the second transistor are exposable to a chemical component and only one is sensitive for the chemical component. For example in the case of two (graphene) transistors, only one may be functionalized and the other one not, while both are exposed.

In embodiments of the present invention only one of the first transistor or the second transistor is exposable to a chemical component and the first transistor and the second transistor are sensitive for the chemical component. For example both transistors may be identical (e.g. two identical chemFETs) and only one is exposed to the chemical component.

FIG. 3 shows the MIT model 10 of a GFET. The model was presented in "Mackin, C. (2018) Graphene chemical and biological sensors: Modeling, systems, and applications". PhD thesis at the Massachusetts Institute of Technology". FIG. 3 shows a fitting 11 by a simple linear and quadratic approximation.

Around the Dirac point ($V_d$), the current vs. gate voltage characteristic can be approximated by a $2^{nd}$ order curve:

$$I_{DS}(V_G) = I_{DS0} + \alpha(V_G - V_d)^2$$

Moving away from the Dirac point, the characteristic becomes more linear and can be approximated by 2 lines:

$$I_{DS}(V_G) = I_{DS1} - 2\alpha V_1(V_G - (V_d - V_1)) \; V_G \leq V_d - V_1$$

$$I_{DS}(V_G) = I_{DS1} + 2\alpha V_1(V_G - (V_d + V_1)) \; V_G \geq V_d + V_1$$

The junctions between the 3 parts are made at gate voltages $V_d - V_1$ and $V_d + V_1$. At those points, $I_{DS} = I_{DS1} = I_{DS0} + \alpha(V_1)^2$ and the slope (transconductance) is $2\alpha V_1$.

$$I_{DS}(V_G) = \{I_{DS1} - 2\alpha V_1(V_G - (V_d - V_1)) \text{ if } V_G \leq V_d - V_1; \\ I_{DS0} + \alpha(V_G - V_d)^2 \text{ if } V_d - V_1 < V_G < V_d + V_1; I_{DS1} + \\ 2\alpha V_1(V_G - (V_d + V_1)) \text{ if } V_G \geq V_d + V_1\}$$

In a system according to embodiments of the present invention wherein the transistor circuit 110 is a GFET, an analog low-pass filter loop automatically adjusts the gate voltage to the Dirac point. The advantage of this approach is that a low-noise, high-resolution measurement of the Dirac point can be obtained in approximately the same time as the cited prior art systems would take for each single step of their gate voltage ramp. In embodiments of the present invention a simple analog circuit/digital circuit can be used what results in a low energy consumption.

A system 100 for measuring a specific voltage (e.g. Dirac voltage) of transistor circuit 110 (e.g. a graphene field effect transistor or a transistor circuit as in FIG. 2) according to embodiments of the present invention comprises the transistor circuit 110, and a bias voltage generator 120 configured for generating a toggling signal, toggling between plus and minus a predefined bias voltage vG around a given bias point. The bias point is thus the average level of the toggling signal generated by the bias voltage generator. The given bias point may for example be zero volt. The invention is, however, not limited thereto. The given bias point may also be different from zero.

The system 100, moreover, comprises a multiplier 140 configured for generating an electrical signal by multiplying an electrical signal which is a function of the drain source current of the transistor circuit (e.g. a channel current IDS of e.g. a graphene field effect transistor 110, or the sum of the currents IDS through the transistors T1 and T2 in the circuit of FIG. 2), with a waveform alternating between two predefined values +A and −A which alternates synchronously with the toggling signal. Depending on the frequency of the toggling gate voltage and the characteristic of the transistor circuit (frequency response), the alternating waveform applied to the multiplier could thereby be delayed (phase shifted) with respect to the gate voltage toggling signal. The predefined value A may for example be equal to 1. The invention is, however, not limited thereto. Also other values of A are possible. The factor A is a multiplication factor for the signal to be integrated. This signal can be the drain current of the transistor circuit (e.g. the GFET drain current), a multiplication of the drain current, the output of a transimpedance amplifier and is referred to as the transistor circuit signal. This signal is integrated by an integrator which also has a gain factor. In embodiments of the present invention A is selected such that the product of all multiplication factors applied to the transistor circuit signal do not lead to saturation of the first integrator at any time. This total gain factor impacts the loop bandwidth and stability. The feedback or feedforward factors are preferably chosen to achieve the desired bandwidth and stability taking into account the transistor circuit characteristic and all multiplicative factors involved in the integration of the transistor circuit signal. In an exemplary embodiment of the present invention A may for example be in a range between 0.001 and 1000.

The system 100, moreover, comprises one or more integrators 130 wherein a first integrator 130, of the one or more integrators 130, is configured for integrating the electrical signal from the multiplier 140, and wherein if more integrators 130 are present, linear combinations of output signals of the integrators are provided to the further integrators 130.

The system 100, moreover, comprises a summator 150 configured for summing the toggling signal of the bias voltage generator 120 and an integration signal, or a processed version thereof, wherein the integration signal is obtained by linearly combining outputs of the one or more integrators 130.

In embodiments of the present invention the system comprises a sample and hold circuit for sampling and holding the integration signal for obtaining the processed version of the integration signal.

In embodiments of the present invention the integration signal may be sampled before the toggling from −A to +A (or from +A to −A) of the toggling signal applied to the multiplier and held for one full period of the toggling signal applied to the multiplier (same frequency as the toggling voltage applied to the gate but possible delay) so until the next toggling from −A to +A (or from +A to −A). The invention is, however, not limited thereto. A sample and hold circuit is not strictly required and if a sample and hold circuit is present, the sample moment may be selected different as specified above.

In embodiments of the present invention the last integrator in the loop may be implemented with a switched-capacitor circuit for providing the sample and hold functionality.

In such a system, according to embodiments of the present invention, a loop is formed. In order for the loop to converge to a stable gate voltage at the specific voltage at the local minimum, the low-pass filter loop has to integrate a quantity that is 0 when the gate voltage is at the specific voltage and which has a linear dependency on the gate voltage in the neighborhood of the specific voltage.

In the vicinity of the specific voltage, the current vs. gate voltage characteristic is a 2nd-order curve so its derivative is a linear function of the gate voltage which is null at the local minimum of the current.

The loop could therefore process the quantity $\Delta I_{DS}(V_G) = I_{DS}(V_G + v_G) - I_{DS}(V_G - v_G)$ where $v_G$ is the predefined bias voltage so that the current difference can be expressed using the derivative of the current at $V_G$:

$$\Delta I_{DS}(V_G) = 2\alpha(V_G - V_d)(2v_G)$$

The system therefore has to process the difference between 2 current measurements performed at slightly different gate voltages. Those current measurements have to be performed in sequence. The gate voltage ($V_{GS}$ also referred to as $V_{Gate}$) applied to the transistor circuit can be periodically toggled between $V_G + v_G$ and $V_G - v_G$ and the difference can be computed inside the integrator by inverting the integrated current when $V_G - v_G$ is applied to the gate:

$$V_{Gate} = V_G + v_G \sum_n \left[1 - 2\left(rect(t-nT) - rect\left(t - \left(n+\frac{1}{2}\right)T\right)\right)\right]$$

-continued $$rect(t - nT) = \{0 \; t < nT \; 1 \; t \geq nT\}$$

$$M(t) = \sum_n \left[1 - 2\left(rect(t - nT) - rect\left(t - \left(n + \frac{1}{2}\right)T\right)\right)\right]$$

$$\int M(t)dt = 0$$

$$M(t)^2 = 1$$

M(t) is a square wave oscillating between A=+1 and −A=−1 with period T and 50% duty-cycle.

$$\int M(t)I_{DS}(t)dt = \int M(t)[I_{DS}(V_G) + 2\alpha(V_G - V_d)M(t)v_G]dt$$

$$= I_{DS}(V_G)\int M(t)dt + \int 2\alpha(V_G - V_d)v_G M(t)^2 dt$$

$$= \int 2\alpha(V_G - V_d)v_G dt$$

Figure 4:
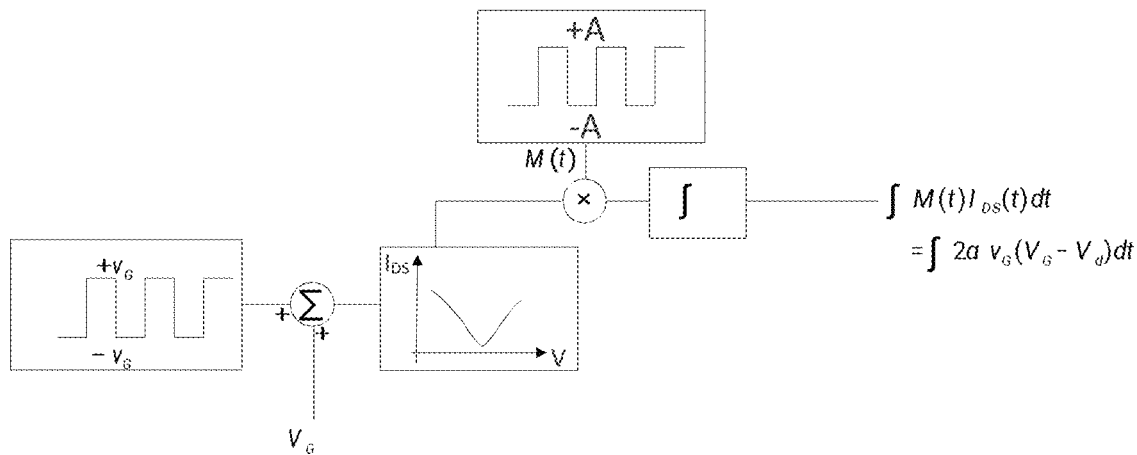
FIG. 4 shows a schematic drawing of a device integrating the transistor circuit current for a system in accordance with embodiments of the present invention.
Figure 5:
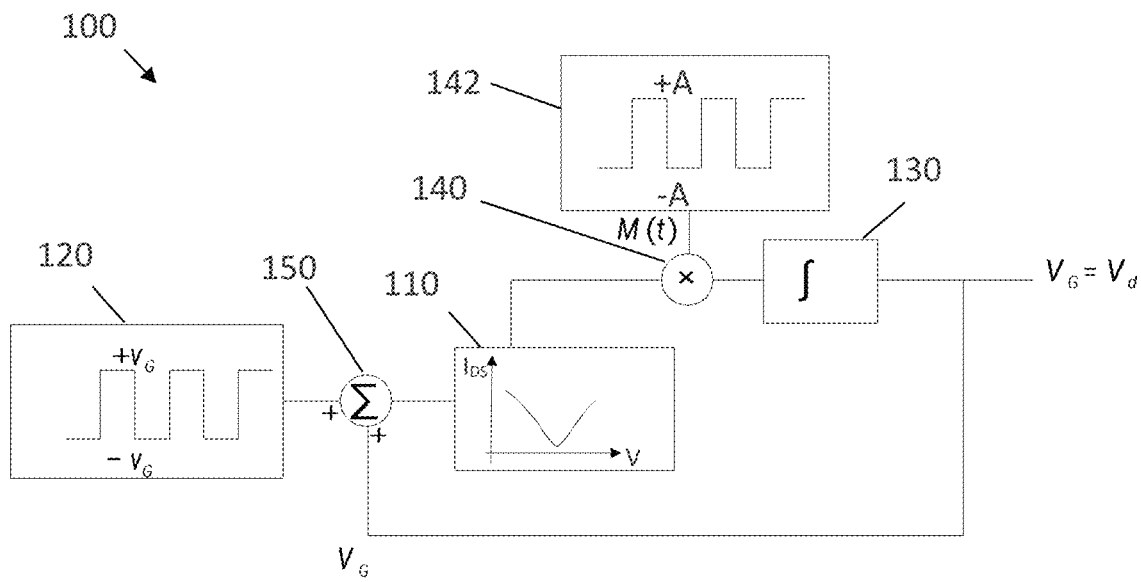
FIG. 5 shows a basic first order measurement loop of a system for measuring a specific voltage of the transistor circuit, in accordance with embodiments of the present invention.

This integration of the drain source current of the transistor circuit is illustrated in FIG. 4. A basic first order measurement loop of a system for measuring the specific voltage at the local minimum (e.g. the Dirac voltage in case the transistor circuit is a GFET), in accordance with embodiments of the present invention is illustrated in FIG. 5. It shows the transistor circuit 110 (represented by its characteristic graph with local minimum in the current voltage characteristic), the bias voltage generator 120, the first integrator 130, the multiplier 140, and the summator 150. In this example the bias point of the bias voltage generator is 0 and as a result thereof the integration signal will in this example be the specific voltage corresponding with the local minimum. If the bias point is different from zero, the integration signal will be the specific voltage minus the bias point.

The integrator integrates the difference between 2 transistor circuit currents corresponding to 2 different gate voltages in order to integrate the slope of the current vs. gate voltage characteristic rather than the current itself.

Figure 6:
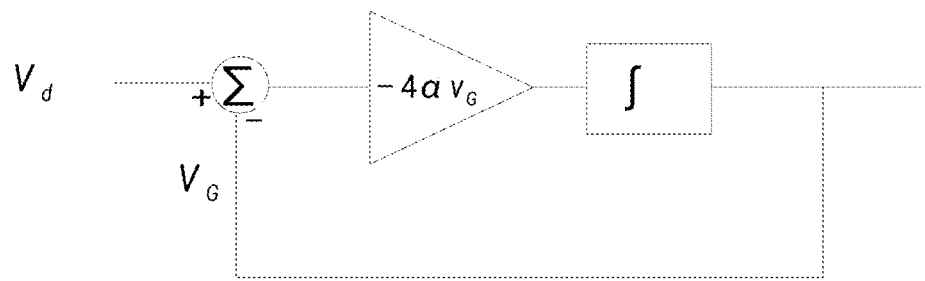
FIG. 6 shows a block diagram of a first order linear system in accordance with embodiments of the present invention.

The basic loop illustrated in FIG. 5 forms a 1st order linear system of which the block diagram is shown in FIG. 6.

Figure 7:
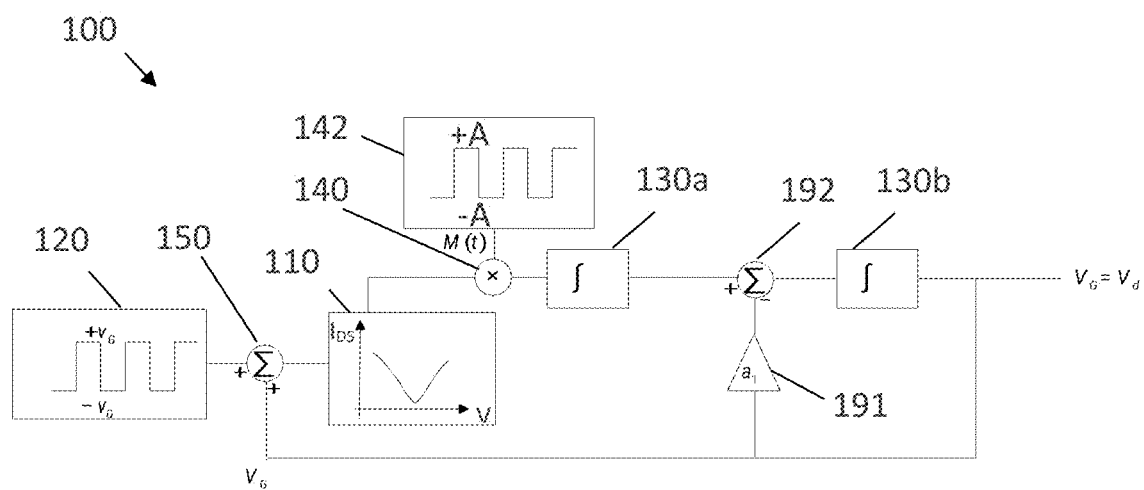
FIG. 7 shows a schematic drawing of a second order system in accordance with embodiments of the present invention.

The loop can be extended up to any order. In embodiments of the present invention the system comprises exactly two integrators wherein an input signal of the second integrator is the sum of an output signal of the first integrator and an output signal of the second integrator multiplied with a predefined constant a1. An example thereof is illustrated in FIG. 7. It shows the transistor circuit 110 (this may for example be a GFET or a transistor circuit as illustrated in FIG. 2), the bias voltage generator 120, the first integrator 130a, the second integrator 130b, the multiplier 140, the summator 150, a multiplier 191 for multiplying an output signal of the second integrator 130b with a predefined constant a1, and a summator 192 for summing the output signal of the first integrator 130a and the output signal of the second integrator 130b.

Figure 8:
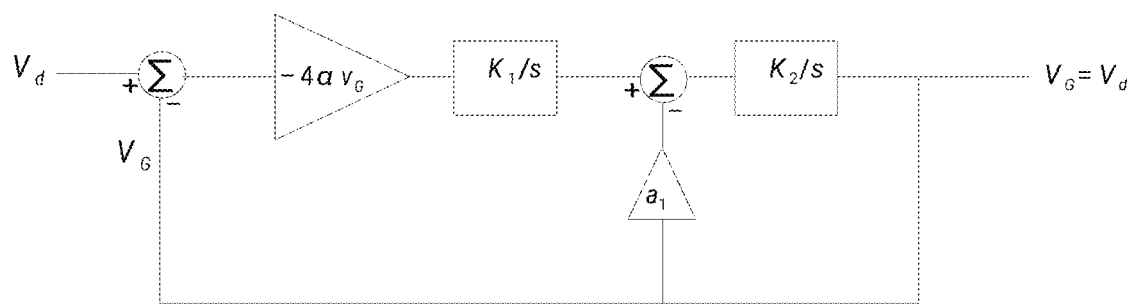
FIG. 8 shows a block diagram of a second order system in accordance with embodiments of the present invention.

The corresponding block diagram of the second order system is illustrated in FIG. 8. In this block diagram K1 holds the product multiplication factors like a possible trans-impedance factor, the amplitude of the multiplication waveform (A) and the capacitor used in the implementation of the of the continuous time integrator. K2 holds the time-constant of the second continuous time integrator.

In embodiments of the present invention the system has a predefined bias voltage modulation which is small enough such that the modulation is inside the quadratic region of the transistor circuit characteristic (e.g. GFET characteristic).

The linear system description is valid when the predefined bias voltage $v_G > 2V_1$ and the gate voltages involved in the difference $I_{DS}(V_G + v_G) - I_{DS}(V_G - v_G)$ are located in both linear regions of the transistor circuit characteristic: $V_G - v_G \leq V_d - V_1$ and $V_G + v_G \geq V_d + V_1$.

In that case, $$I_{DS}(V_G + v_G) - I_{DS}(V_G - v_G)$$

$$= I_{DS1} + 2\alpha V_1(V_G - (V_d + V_1)) -$$

$$[I_{DS1} - 2\alpha V_1(V_G - (V_d - V_1))]$$

$$= 4\alpha V_1(V_G - V_d)$$

The difference with respect to the previous case is that the gain is $4\alpha V_1$ instead of $4\alpha v_G$.

Using a large gate voltage modulation allows to search for the specific voltage over a large gate voltage range.

In embodiments of the present invention the loop can be implemented with continuous time integrator or discrete-time integrators.

The following Matlab simulation results show the behavior of the described $2^{nd}$-order system for which the transistor circuit is a GFET. The MIT model 10 used for the GFET has a Dirac point at $V_d = 0.61$ V. The approximation 11 described in the document has the following parameters: $\alpha = 0.0016$ A/V², $V_1 = 0.0457$ V, $I_{DS0} = 23$ µA. These parameters are the parameters for the model in FIG. 3.

Figure 9:
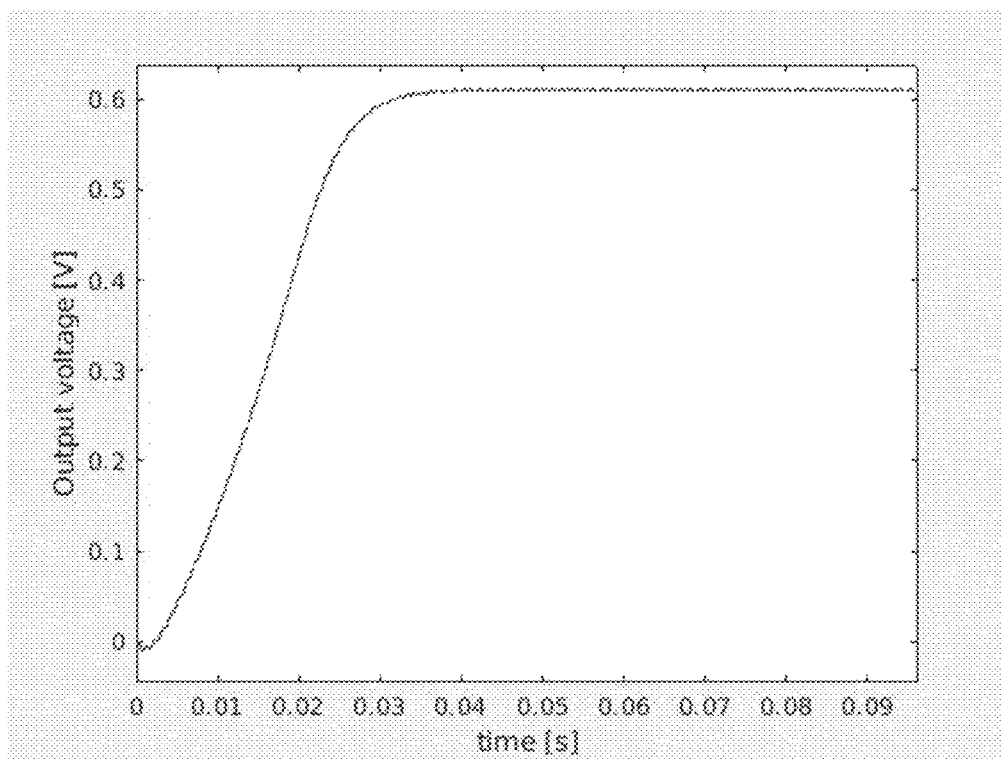
FIG. 9 shows the output voltage of a system with large gain modulation of a second order system with a bandwidth of 70 Hz in accordance with embodiments of the present invention.
Figure 10:
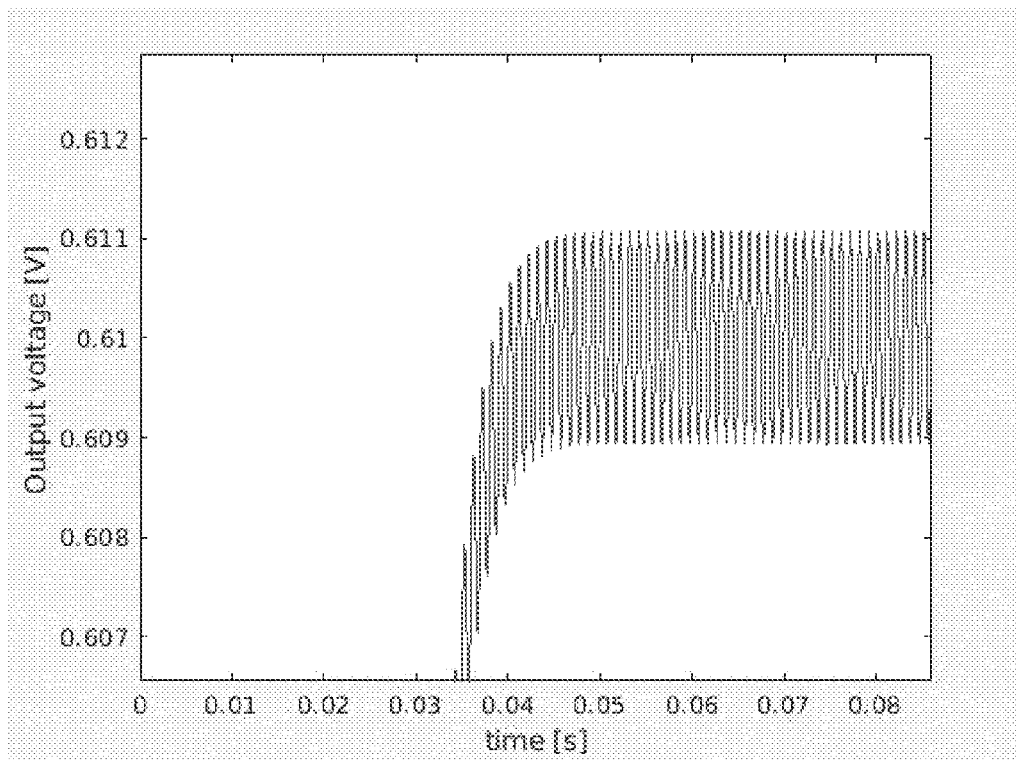
FIG. 10 shows a zoomed-in version of FIG. 9.
Figure 11:
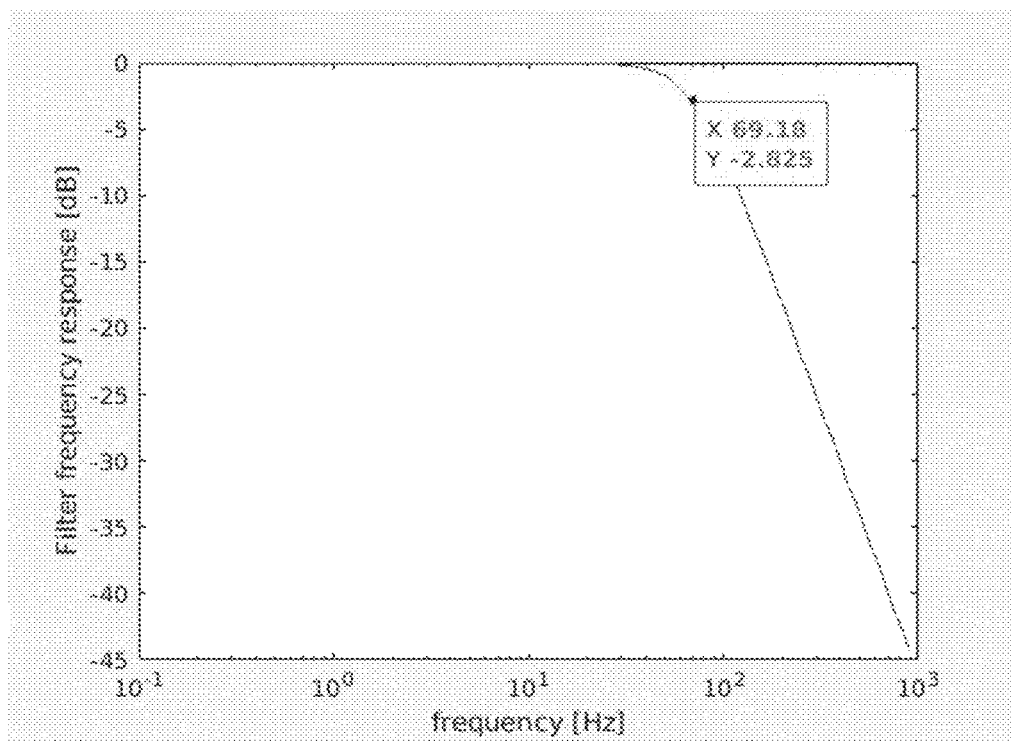
FIG. 11 shows the frequency response of the second order system which was also used for obtaining the simulation results of FIG. 9.

A first loop was constructed with 70 Hz bandwidth approximately. The predefined bias voltage was +/−0.2V (i.e. large gate voltage modulation) at 1 kHz. The loop parameters were calculated considering the gain value $4\alpha V_1$. The simulation results in FIG. 9 and FIG. 10 show that the output of the filter reaches the Dirac voltage in less than 50 ms (see FIG. 7). There is +/−1 mV residual oscillation at 1 kHz (see FIG. 10 which is a zoomed-in version of FIG. 9 between 0.607 and 0.612 V). FIG. 11 shows the frequency response of the second order system.

Figure 12:
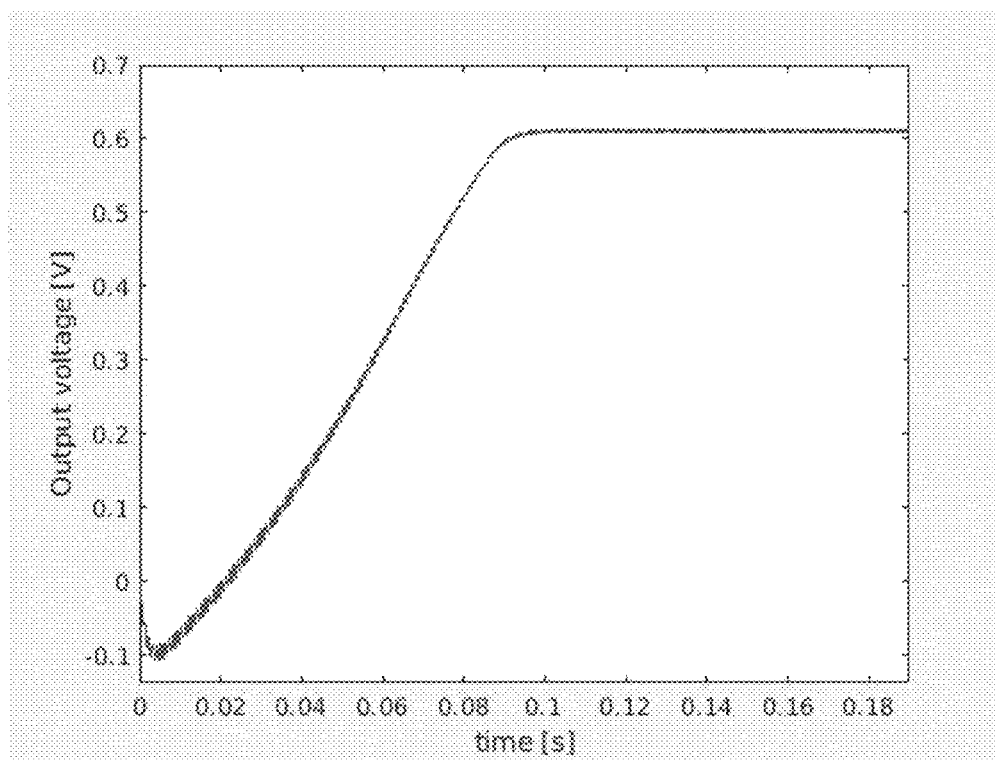
FIG. 12 shows the output voltage as function of time of a system with small gain modulation of a second order system with a bandwidth of 70 Hz in accordance with embodiments of the present invention.

The following simulation results show a second loop design with the same bandwidth of 70 Hz but using a predefined bias voltage $v_G$ of 0.01V (i.e. small gate voltage modulation) instead of 0.2V. The loop parameters were calculated considering the gain value $4\alpha v_G$. The integrator time constants are therefore different from the ones used with the larger bias voltage. The plot in FIG. 12 shows the settling at the output of the second order system with a small gate voltage modulation. The correct value is reached within 100 ms starting from discharged integrators. The loop first operates outside the quadratic GFET current region where the current difference $\Delta I_{DS}(V_G) = -2\alpha V_1$ is constant instead of being proportional to $V_G$. The loop only starts working when $V_G$ enters the quadratic region. This is further explained in the paragraph below.

Figure 13:
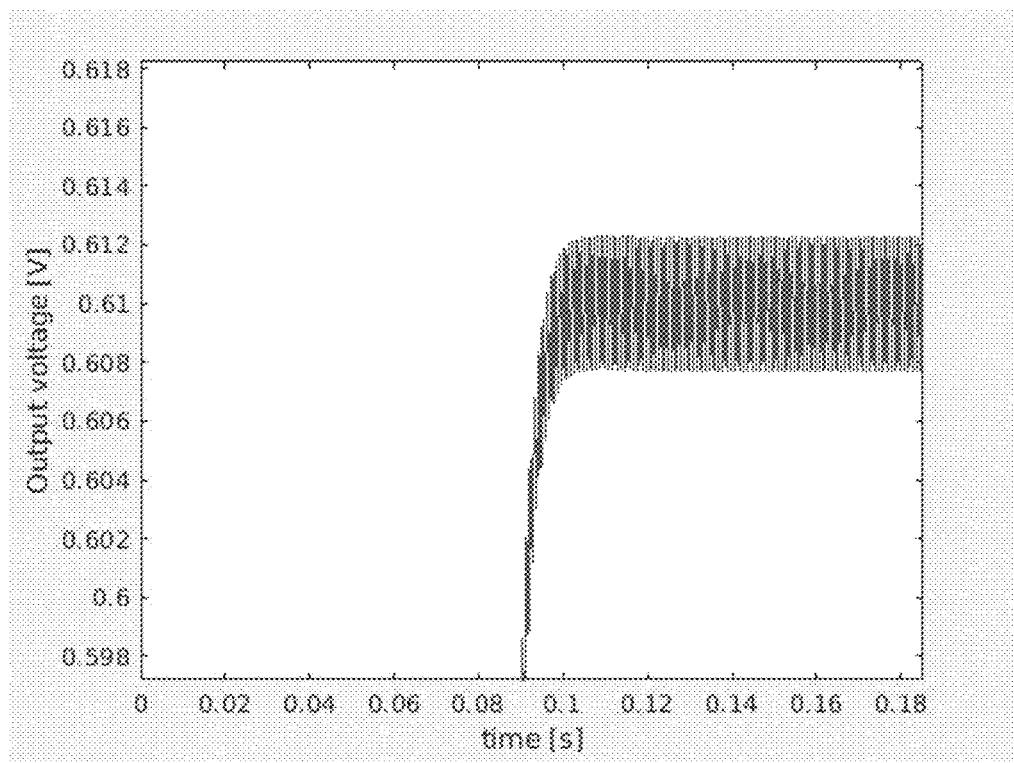
FIG. 13 shows a zoomed-in version of FIG. 12.

The residual oscillation of the second order system with 70 Hz bandwidth and small gate voltage modulation at 1 kHz has 2 mV amplitude. This is illustrated in FIG. 13 which shows a zoomed-in version of FIG. 12 between 0.598 and 0.618 V.

Figure 14:
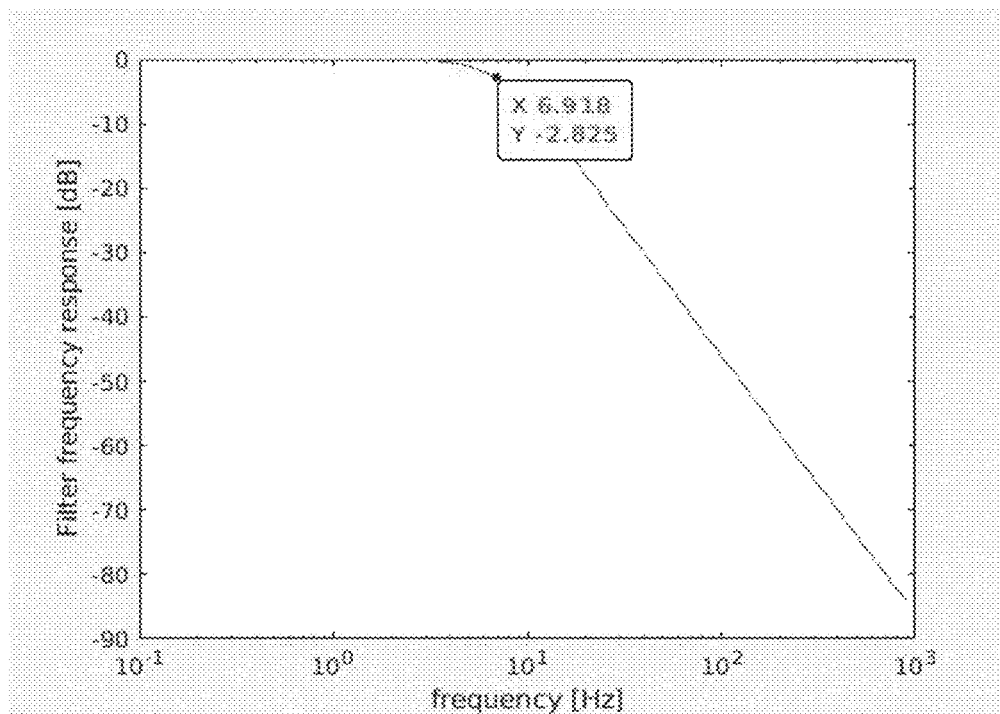
FIG. 14 shows the frequency response of a system with large gain modulation of a second order system with a bandwidth of 7 Hz in accordance with embodiments of the present invention.
Figure 15:
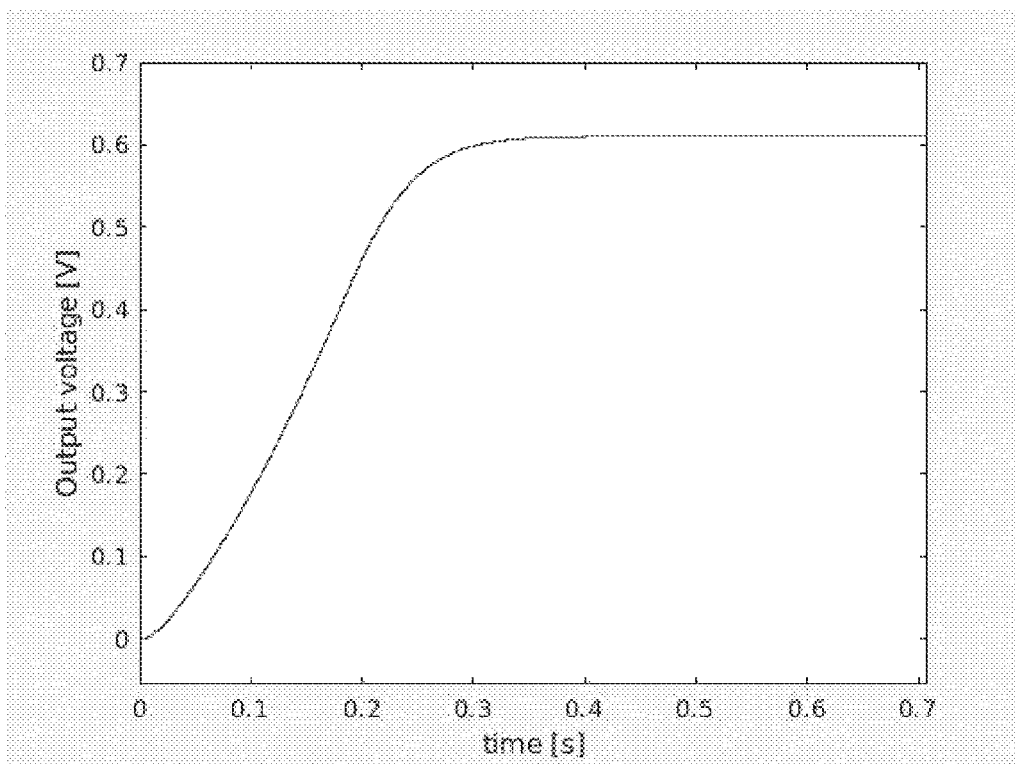
FIG. 15 shows the output voltage of the system of FIG. 14.
Figure 16:
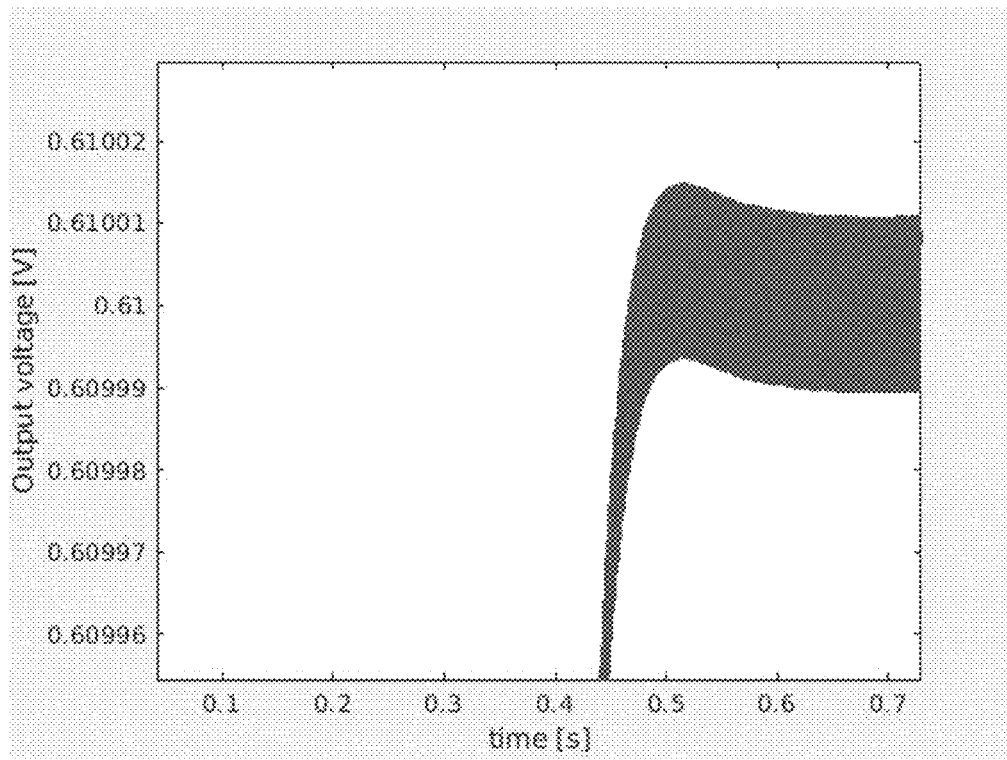
FIG. 16 shows a zoomed-in version of FIG. 15.

The oscillations can be reduced with a smaller filter bandwidth. FIGS. 14, 15 and 16 show the results for a loop with less than 7 Hz bandwidth and large gate signal modulation. The filter settles within 500 ms with 15 μV residual oscillation. FIG. 14 shows the frequency response of the 2nd-order system with 7 Hz bandwidth and large gate voltage modulation. FIG. 15 shows a Matlab simulation result illustrating the settling of the 7 Hz-bandwidth, 2nd-order system with large gate voltage modulation. FIG. 15 shows a Matlab simulation result illustrating the residual oscillation at the output of the 7 Hz-bandwidth, 2nd-order system with large gate voltage modulation. The residual oscillation can be reduced by introducing the sample and hold circuit. It is, however, not strictly required.

In embodiments of the present invention the system 100 comprises a quantizer 160 which is configured for quantizing the integrator signal at a predefined sampling frequency. The system 100, moreover, comprises a digital to analog converter 170 for converting the quantized signal into an analog signal for summing with the toggling signal at the summator 150.

Thus, the low-pass filter loop is converted into sigma-delta modulator. This is possible because of the linear relationship between the current difference, $\Delta I_{DS}$, and the gate voltage.

Figure 17:
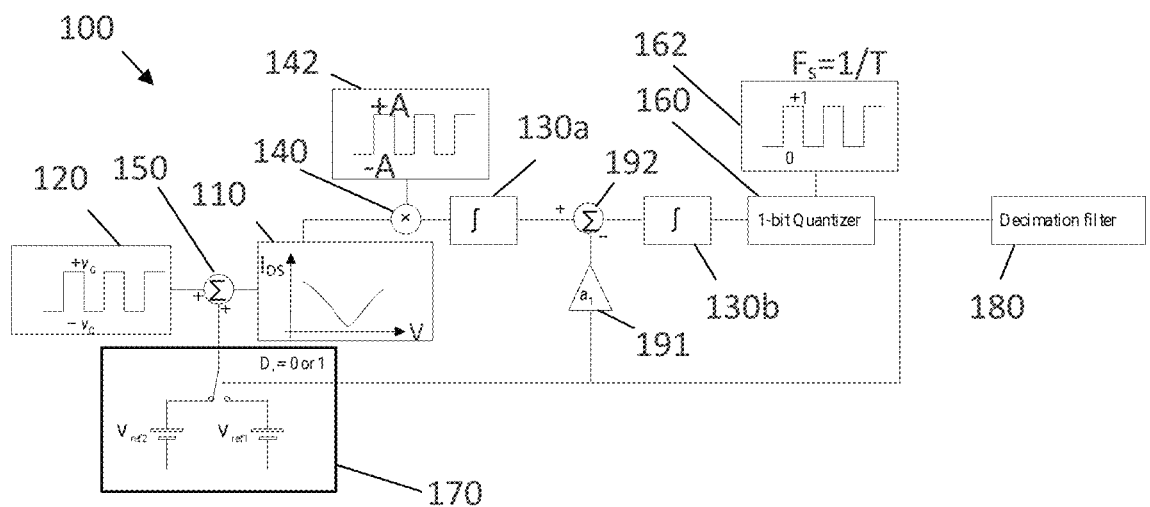
FIG. 17 shows a schematic diagram of an exemplary system for measuring a specific gate voltage resulting in a minimum current of a transistor circuit, the system comprising a 1-bit quantizer and digital to analog converter, in accordance with embodiments of the present invention.

FIG. 17 shows a schematic diagram of an exemplary system for measuring the specific voltage corresponding with the local minimum of the current of a transistor circuit (this may for example be a GFET), comprising a 2nd-order sigma-delta ADC, in accordance with embodiments of the present invention.

The system 100 of FIG. 17 comprises the transistor circuit 110, a bias voltage generator 120, a digital to analog converter 170, a summator 150 for summing the signal from the bias voltage generator 120 and the signal from the digital to analog converter 170. The output of the summator 150 is connected to the gate of the transistor circuit 110. The system 100 furthermore comprises a waveform generator 142 configured for generating a waveform alternating between +A and −A, and a multiplier 140 configured for multiplying the waveform of the waveform generator with an electrical signal which is a function of a channel current of e.g. the GFET or the resulting sum of the two channel currents of the both transistors of the transistor circuit 110. The system, furthermore, comprises a first integrator 130a for integrating the signal from the multiplier 140 and a second integrator 130b for integrating the sum, obtained using a summator 192, of the signal from the first integrator 130a and the quantized output of the second integrator multiplied with a predefined factor a1 using a multiplier 191. The system, furthermore, comprises a 1-bit quantizer for quantizing the output signal of the second integrator 130b. The system, furthermore, comprises a decimation filter 180 at the output of the quantizer.

In the exemplary embodiment illustrated in FIG. 17, instead of smoothly adjusting the gate voltage to the specific voltage (e.g. Dirac point in case of e.g. a GFET), the sigma-delta loop toggles the gate voltage $V_G$ between 2 fixed voltages, $V_{ref1}$ and $V_{ref2}$, within the region of validity of the linear relationship between the current difference and the gate voltage. The output of the 1-bit quantizer is, therefore, connected to a switch of the digital to analog converter 170 which switches between $V_{ref1}$ and $V_{ref2}$ and connects them alternatingly to the summator 150.

The transistor circuit 110 is then operated at 4 possible different voltages only: $V_{ref1} \pm v_G$ and $V_{ref2} \pm v_G$, wherein $v_G$ is the predefined voltage of the bias voltage generator 120. Those will generate only 2 different values for the current difference:

$$\Delta I_{DS1} = \Delta I_{DS}(V_{ref1}) = I_{DS}(V_{ref1} + v_G) - I_{DS}(V_{ref1} - v_G)$$

$$\Delta I_{DS2} = \Delta I_{DS}(V_{ref2}) = I_{DS}(V_{ref2} + v_G) - I_{DS}(V_{ref2} - v_G)$$

In order for a linear relationship to be valid, the gate voltages must be chosen as follows. If one uses a small gate voltage modulation (i.e. within the quadratic region of the transistor circuit), $v_G$, all 4 gate voltages have to be in the central quadratic part of the transistor circuit characteristic. In embodiments of the present invention small $v_G$ signal modulation is used in the quadratic region so that at the first predefined voltage, the gate voltage is toggling between 2 levels both at the left side of the specific voltage (the gate voltage is smaller than the specific voltage $V_d$) and at the second predefined voltage, both levels will be at the right side of the specific voltage (the gate voltage is larger than the specific voltage $V_d$).

In order for a linear relationship to be valid, if one uses a large gate voltage modulation (i.e. within the linear region of the transistor circuit), $v_G$, all 4 gate voltages have to be outside the central quadratic part of the transistor circuit characteristic:

| | | |
|---|---|---|
| i. | $V_{ref1} + v_G > V_d$ | (right linear region) |
| ii. | $V_{ref1} - v_G < V_d$ | (left linear region) |
| iii. | $V_{ref2} + v_G > V_d$ | (right linear region) |
| iv. | $V_{ref2} - v_G < V_d$ | (left linear region) |

In embodiments of the present invention the sigma-delta loop is sampling at the gate voltage modulation frequency $$\left(F_s = \frac{1}{T}\right).$$

This is illustrated by the sampling trigger signal 162 in FIG. 17. The sigma-delta loop delivers a bit stream alternating between 0 and 1. Let D be the ratio between the number of 1s and the total number of bits in the bit stream.

The sigma delta loop will adjust D such that the average of $\Delta I_{DS}$ is 0. $\Delta I_{DS}$ thereby is proportional to the slope of the transistor circuit $I_{DS}$ vs. $V_{Gs}$ characteristic and becomes 0 at the specific voltage. The sigma-delta modulator generates its feedback signal such that the quantity that is integrated by the integrator is 0 in average.

$$I_{DS} = D\Delta I_{DS2} + (1-D)\Delta I_{DS1}$$

Supposing large gate voltage modulation:

$$I_{DS} = D4\alpha V_1(V_{ref2} - V_d) + (1-D)4\alpha V_1(V_{ref1} - V_d)$$

$I_{DS} = 0$, therefore:

$$D(V_{ref2} - V_d) + (1-D)(V_{ref1} - V_d) = 0$$

$$D(V_{ref2} - V_{ref1}) + V_{ref1} - V_d = 0$$

$$V_d = D(V_{ref2} - V_{ref1}) + V_{ref1}$$

The invention is not limited to sigma-delta modulators of the second order. Also sigma delta modulators of different orders may be used.

In embodiments of the present invention the integrators can be continuous-time or discrete-time integrators.

A Matlab simulation of an exemplary system, in accordance with embodiments of the present invention and illustrated in FIG. 17, applied to the GFET described by the MIT model has been executed. The Dirac point is at 0.61V and the limit of the quadratic region is $V_1 = 0.045V$.

If the converter is able to make accurate conversions over the full reference voltage range, from $V_{ref1}$ to $V_{ref2}$, the system is able to measure a Dirac voltage for a GFET or the voltage for a minimum $I_{DS}$ of the both Ts in a transistor circuit 110 (i.e. the specific voltage of the transistor circuit) in the range from $V_{ref1}$ to $V_{ref2}$.

If the system is operated with a large gate modulation, the following conditions have to be fulfilled:

$V_{ref1}+v_G$ should be in the right linear region, hence:

$$V_{ref1}+v_G \geq V_{ref2}+V_1 \Rightarrow v_G \geq V_{ref2}-V_{ref1}+V_1$$

$V_{ref1}-v_G$ should be in the left linear region, hence:

$$V_{ref1}-v_G \leq V_{ref1}-V_1 \Rightarrow v_G \geq V_1$$

$V_{ref2}+v_G$ should be in the right linear region, hence:

$$V_{ref2}+v_G \geq V_{ref2}+V_1 \Rightarrow v_G \geq V_1$$

$V_{ref2}-v_G$ should be in the left linear region, hence:

$$V_{ref2}-v_G \leq V_{ref1}-V_1 \Rightarrow v_G \geq V_{ref2}-V_{ref1}+V_1 \quad \text{a.}$$

Therefore, in this exemplary embodiment of the present invention, the predefined bias voltage, also referred to as the modulation voltage, $v_G$ must meet the following condition:

$$v_G \geq V_{ref2}-V_{ref1}+V_1 \quad \text{i.}$$

For the simulation, the following values have been used: $V_{ref1}=0.55$ V, $V_{ref2}=0.65$ V and $v_G=0.145$V. The sample frequency $F_S=1$ kHz. In embodiments of the present invention the system comprises a decimation filter. The decimation filter may for example be a sinc3 filter with an oversampling rate of 256.

In view of the values given above, the GFET is operated at the following gate voltages:

$$V_{ref1}+v_G=0.695 \; V \quad \text{a.}$$

$$V_{ref1}-v_G=0.405 \; V \quad \text{b.}$$

$$V_{ref2}+v_G=0.795 \; V \quad \text{c.}$$

$$V_{ref2}-v_G=0.505 \; V \quad \text{d.}$$

Figure 18:
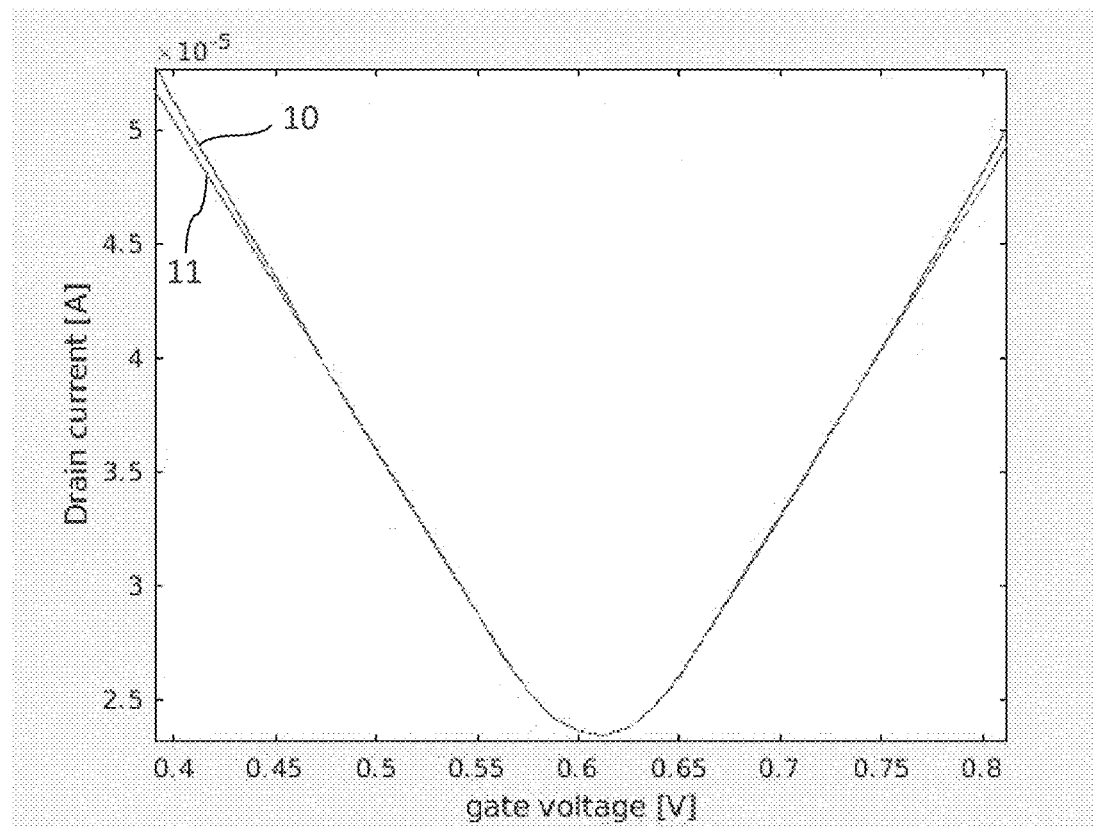
FIG. 18 shows a GFET characteristic and its linear approximation used by a system comprising a quantizer and digital to analog converter, in accordance with embodiments of the present invention.

It can be seen on the plot of FIG. 18 that those values are at the limit of the linear approximation. In the plot the drain current is shown in function of the drain current for the accurate model 10 and the approximation 11. The output of the decimation filter gives a Dirac point measurement at 0.6099V.

Figure 19:
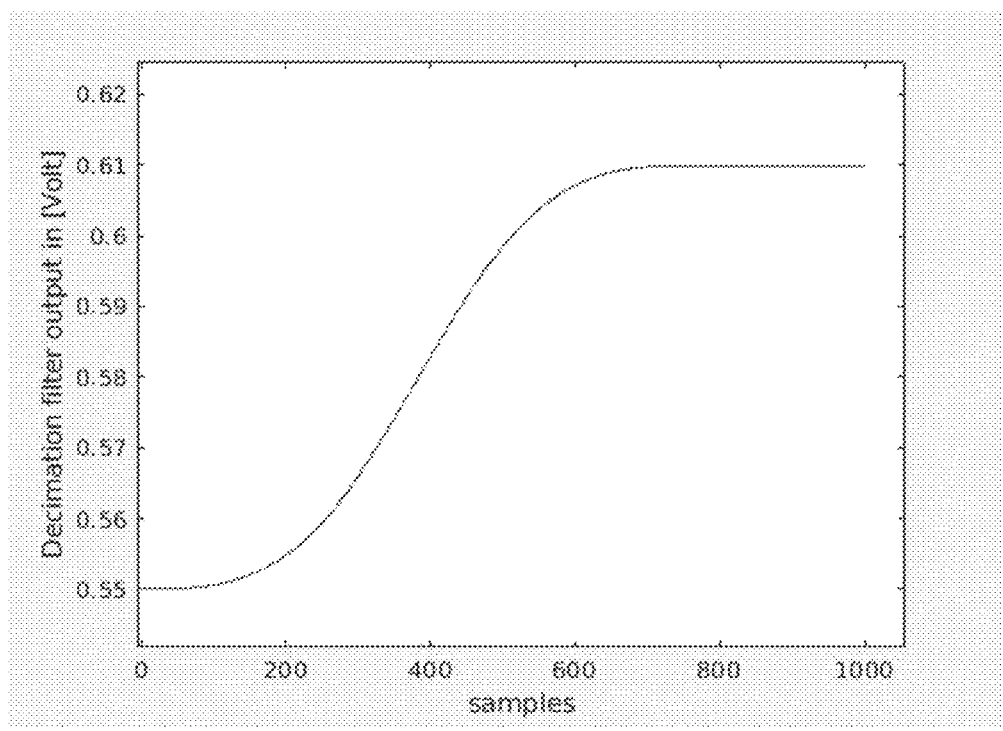
FIG. 19 shows the output of a decimation filter converted to voltage, of a system in accordance with embodiments of the present invention.

FIG. 19 shows the output of the decimation filter converted to voltage. The output of the filter settles within 3*256 samples corresponding to a settling time of 768 ms.

Figure 20:
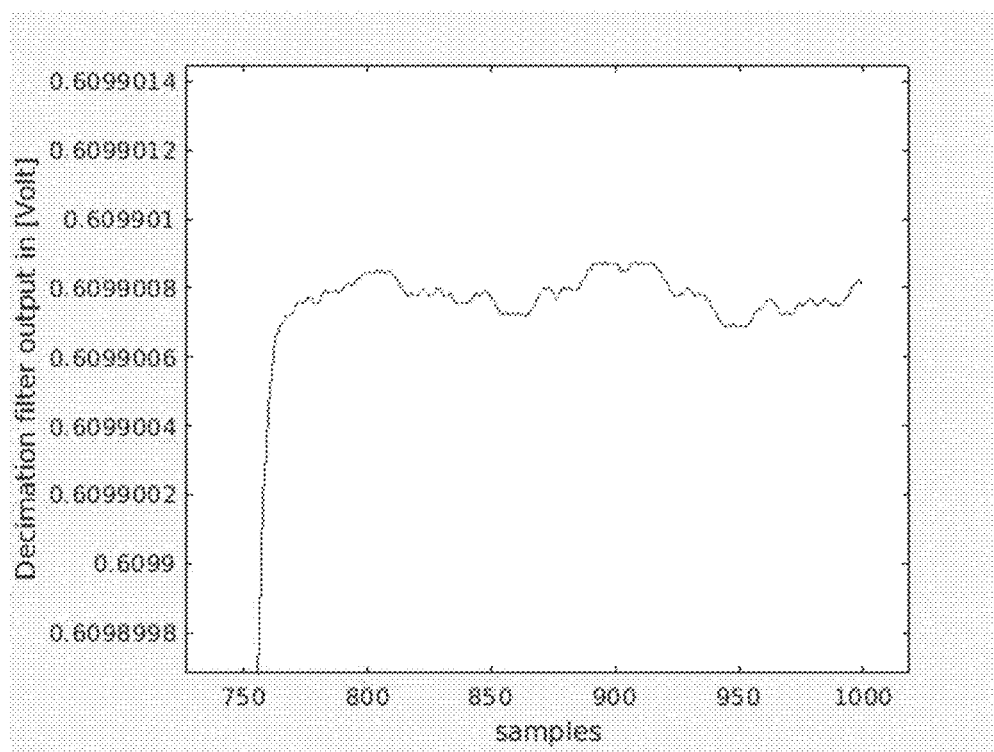
FIG. 20 shows a plot zoomed to the settled output of the decimation filter of FIG. 19.

FIG. 20 shows a plot zoomed to the settled output of the decimation filter.

Figure 21:
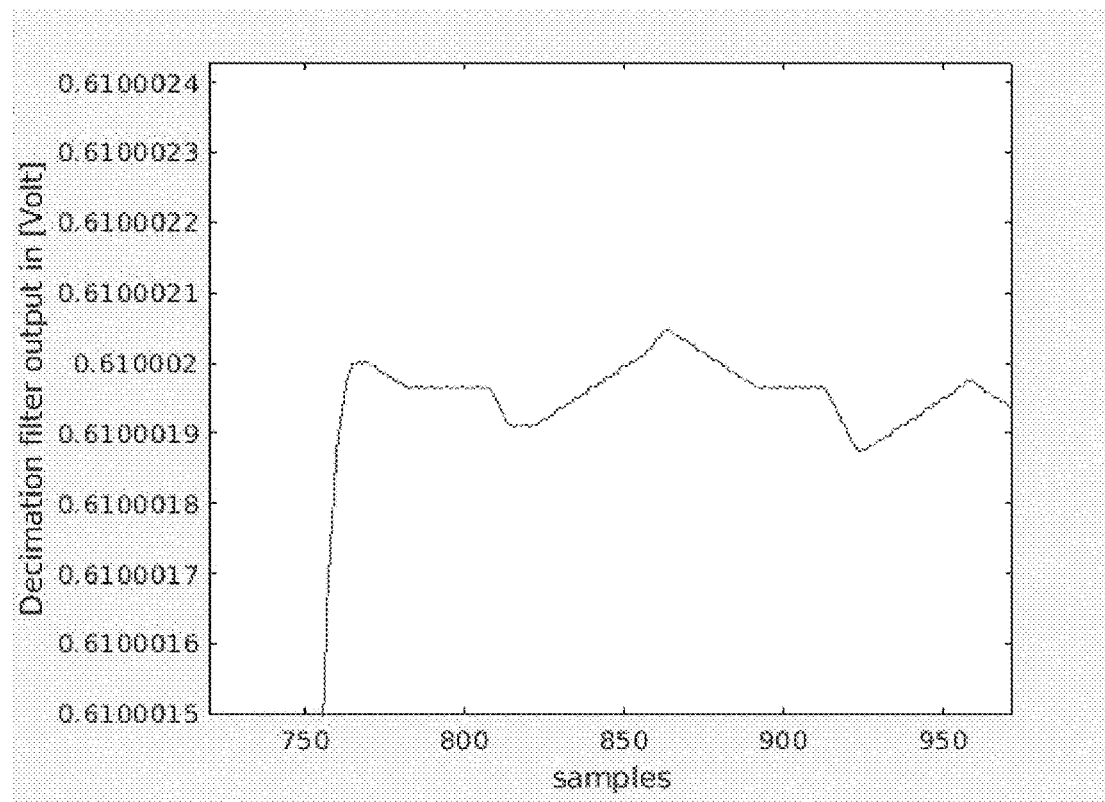
FIG. 21 shows a plot zoomed to the settled output of the decimation filter for reference voltages which are closer to the specific voltage compared to reference voltages used for obtaining the plot of FIG. 20.

In an alternative embodiment of the present invention the reference voltages may be selected closer to the actual Dirac voltage. The following values may for example be selected: $V_{ref1}=0.58$ V, $V_{ref2}=0.63$ V and $v_G=0.095$V. In this example the GFET is operated at 4 gates voltages where the linear approximation holds better which yields a better estimation of the Dirac point. This is illustrated in FIG. 21 which shows a plot zoomed to the settled output of the decimation filter for the values cited above.

Figure 22:
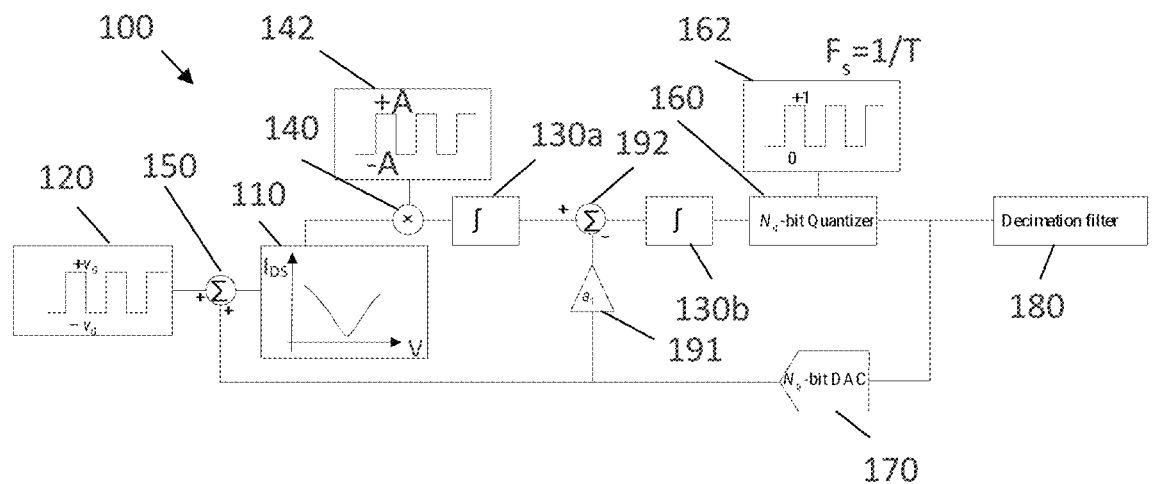
FIG. 22 shows a schematic diagram of an exemplary system for measuring the specific voltage of a transistor circuit, the system comprising a Nq-bit quantizer and Nq-bit digital to analog converter, in accordance with embodiments of the present invention.

In embodiments of the present invention the quantizer 160 is a multi-bit quantizer with a predefined number of $N_q$ bits, wherein the digital to analog converter 170 has $N_q$ bits. An exemplary embodiment of such a system is shown in FIG. 22. The schematic diagram is similar to the schematic in FIG. 17 except for the fact that the quantizer is a $N_q$ bits quantizer and the digital to analog converter 170 has $N_q$ bits.

The multi-bit approach allows to search for the specific voltage in a wide range. In embodiments of the present invention the initial settling of the loop will take care of the initial guess of the specific voltage and eventually, the DAC will toggle between 2 or 3 levels only.

In embodiments of the present invention the multi-bit quantizer inside the sigma-delta loop is a low-resolution ADC. In embodiments of the present invention it is not just converting the output of the current integrator but a linear combination of the outputs of several integrators. In the example the output voltage of the second integrator is converted.

In embodiments of the present invention the output of the low-resolution multi-bit quantizer is directly connected to the low-resolution DAC without any processing by a control circuit configured to determine a voltage value applied to a control electrode of the control circuit.

As explained earlier the linear relationship between the current differences $\Delta I_{DS}$ and the 2 reference voltages $V_{ref1}$, $V_{ref2}$ must be valid in order for the single-bit sigma-delta to deliver the correct value for the Dirac voltage.

The reference voltages can be extended beyond the regions of validity of the linear relationship if a multi-bit quantizer is used in the sigma-delta loop.

Instead of feeding back only 2 different gate voltages at the extremes of the $[V_{ref1}; V_{ref2}]$ range, the loop will feedback $2^{N_q}$ different possible DAC voltages which are uniformly spread over the range $[V_{ref1}; V_{ref2}]$, $N_q$ being the number of bits of the quantizer used inside the loop. After some settling time, the loop will automatically converge to a situation where the feedback gate voltage will toggle between a few of those possible feedback voltages only, all being located in the neighborhood of the specific voltage. In embodiments of the present invention the number of bits of the quantizer is chosen such that the several consecutive DAC voltages are inside the region of validity of the linear relationship between the current difference and the gate voltage.

In the following simulation the transistor circuit is a GFET. The following simulation illustrates the operation of a multi-bit sigma-delta with small gate voltage modulation ($v_G=5$ mV) able to give a digital code for the Dirac voltage in the range from 0V to 1V using a 5-bit quantizer and a 32-level DAC. The GFET model is the same as before. For small gate modulation, the current difference is linear vs. the gate voltage in the gate voltage range $[V_d-0.045; V_d+0.045]$. The DAC step is 1V/32=30 mV so that 2 or 3 DAC levels are inside that gate voltage range.

Figure 23:
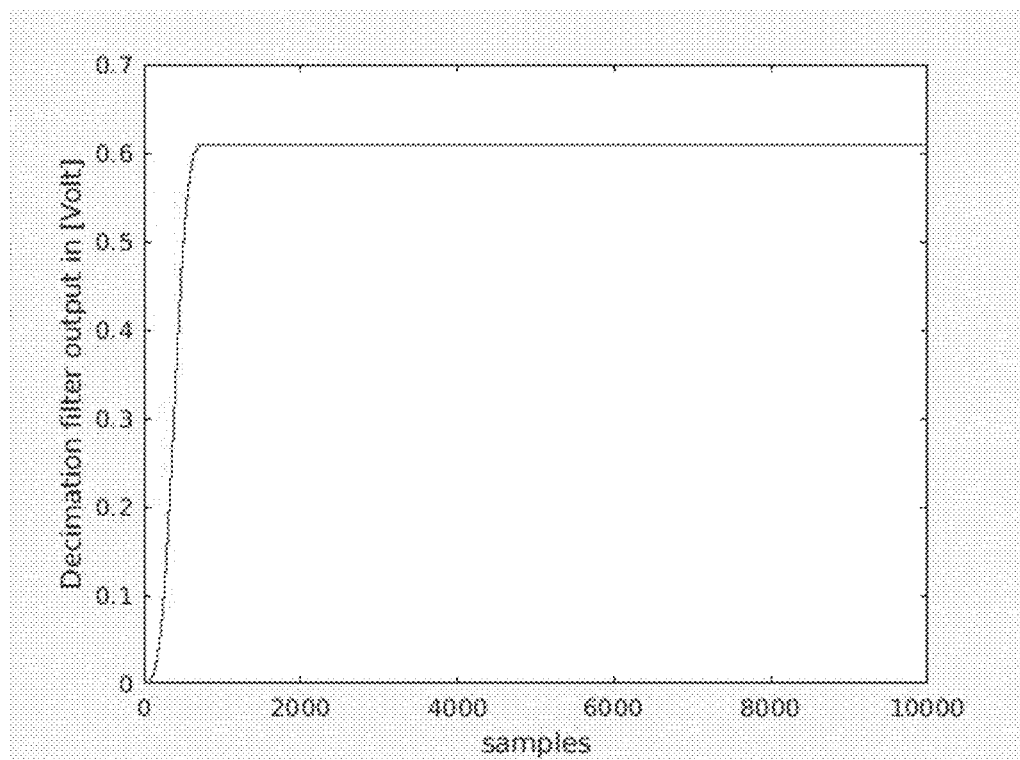
FIG. 23 shows a plot of the decimation filter output in function of the sample number for a simulation illustrating the operation of a system comprising a Nq-bit quantizer and Nq-bit digital to analog converter in accordance with embodiments of the present invention.
Figure 24:
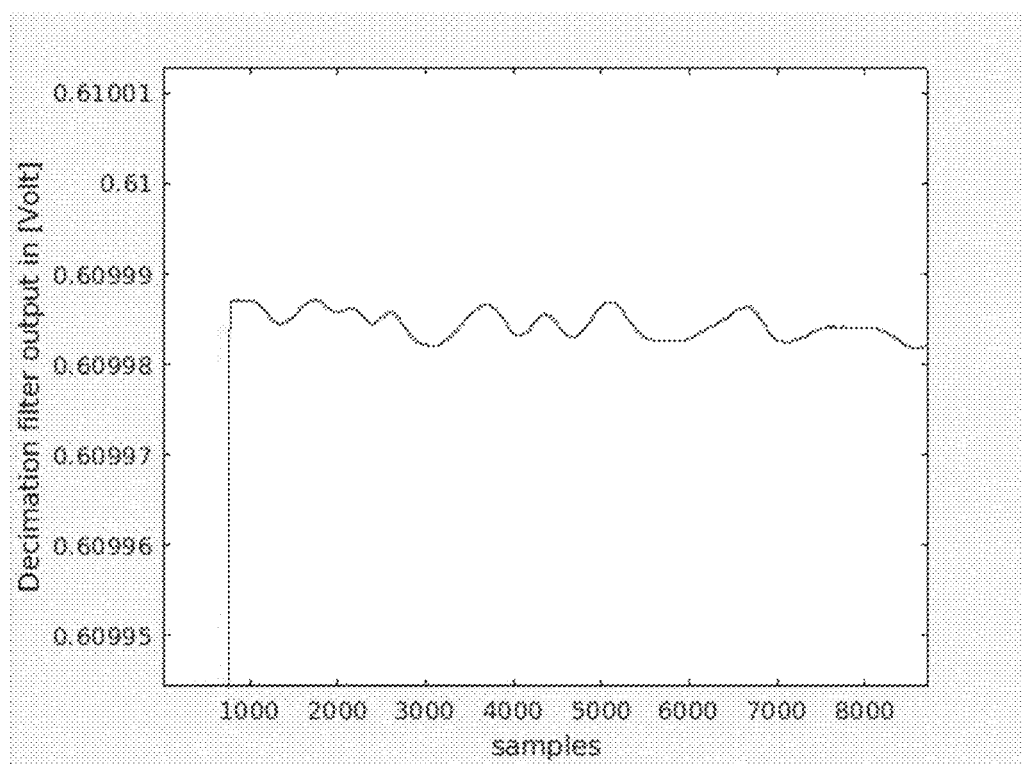
FIG. 24 shows a plot zoomed to the settled output of the decimation filter of the same simulation as in FIG. 23.
Figure 25:
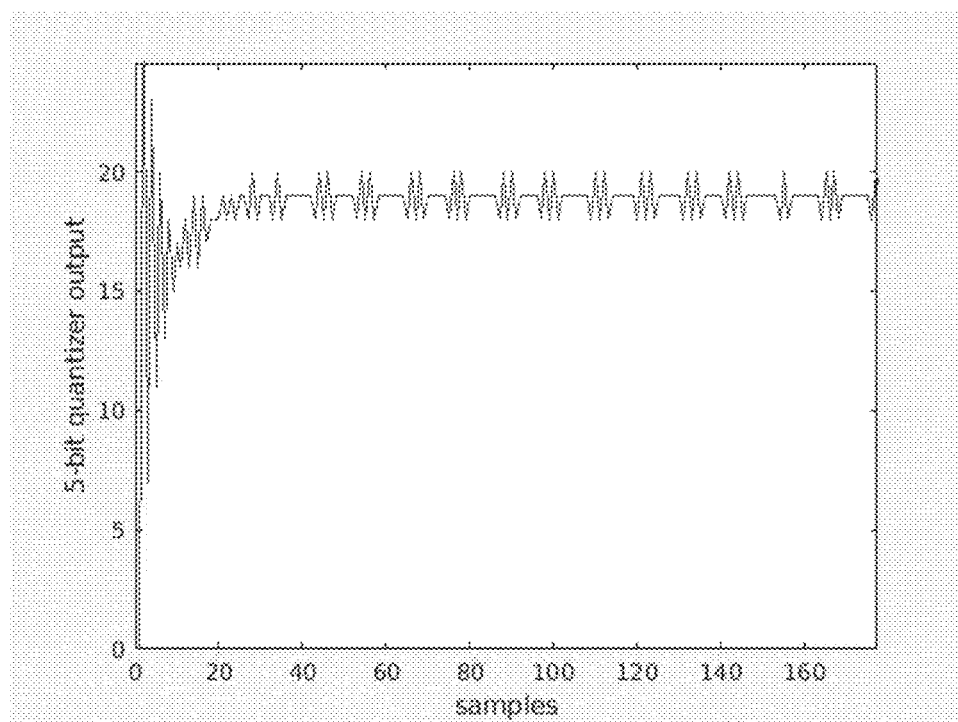
FIG. 25 shows the 5-bit quantizer output in function of the sample number, of the same simulation as in FIG. 23.

FIG. 23 shows a plot of the decimation filter output in function of the sample number. FIG. 24 shows a zoom to the output of the decimation filter. FIG. 25 shows the 5-bit quantizer output in function of the sample number.

With a small vG modulation signal, preferably there are several consecutive DAC voltages inside the quadratic region of the GFET IDS vs. VG characteristic so that the slope (the quantity that is integrated) is proportional to the applied gate voltage. That is the condition to form a linear feedback system and have an accurate measurement of the Dirac voltage as the successive DAC voltages. Indeed several DAC voltage outputs Vdac+/−vG are preferably in the quadratic region.

Note that the system will likely start in the linear region where the slope is constant. At that moment, there will be no actual feedback but the integrators will make the DAC voltage go to the direction of the Dirac voltage. It is only when the DAC voltage enters the curved part of the characteristic that there will be an actual feedback signal and that the loop will settle. The closer to a 2nd order characteristic, the more accurate the measurement of the Dirac point.

The system 100 may comprise an upper system (e.g. a controller) for selecting the reference voltages of the system 100 so that the loop always starts in a first stage wherein the predefined bias voltage vG is selected such that the sum obtained by the summator is in a linear region of the graphene field effect transistor characteristic and settles down to a first Dirac voltage that is preferably in the quadratic region. In a second stage the upper system is configured for selecting the predefined bias voltage such that the sum obtained by the summator is inside the quadratic region of the graphene field effect transistor characteristic. The system then settles down to a second Dirac voltage which may be more or at least as accurate as the first obtained Dirac voltage. Thus, a system is obtained which performs the Dirac point measurement in a two stage approach.

The invention claimed is:

1. A system for characterizing a transistor circuit which comprises a gate, a source, and a drain, wherein the transistor circuit is configured such that a drain source current versus gate source voltage transfer function has a local minimum for a specific voltage, wherein the system is configured for measuring the specific voltage, the system comprising:
the transistor circuit,
a bias voltage generator configured for generating a toggling signal, toggling between plus and minus a predefined bias voltage v G around a given bias point,
one or more integrators,
a multiplier configured for generating an electrical signal by multiplying an electrical signal which is a function of the drain source current of the transistor circuit, with a waveform alternating between two predefined values plus and minus A which alternates synchronously with the toggling signal,
wherein a first integrator, of the one or more integrators, is configured for integrating the electrical signal from the multiplier, and wherein if more integrators are present, linear combinations of output signals of the integrators are provided to the further integrators,
a summator configured for summing the toggling signal and an integration signal, or a processed version thereof, wherein the integration signal is obtained by linearly combining outputs of the one or more integrators and configured for outputting the sum as gate source voltage of the transistor circuit.

2. The system according to claim 1 wherein the transistor circuit comprises:
a first transistor and a second transistor,
a first voltage converter configured for converting a voltage at the gate of the transistor circuit or at the source of the transistor circuit, according to a transfer function with a first slope, into a gate source voltage between the gate and the source of the first transistor,
a second voltage converter configured for converting a voltage at the gate of the transistor circuit or at the source of the transistor circuit, according to a transfer function with a second slope, into a gate source voltage between the gate and the source of the second transistor,
wherein the first slope and the second slope have opposite signs.

3. The system according to claim 2, wherein the first transistor or the second transistor is exposable to and sensitive for a chemical component, or wherein the first transistor and the second transistor are exposable to a chemical component and only one is sensitive for the chemical component, or wherein either the first transistor or the second transistor is exposable to a chemical component and wherein the first transistor and the second transistor are sensitive for the chemical component.

4. The system according to claim 2 wherein the first transistor and the second transistor are metal-oxide-semiconductor FET or bipolar transistors.

5. The system according to claim 1 wherein the transistor circuit is a graphene FET.

6. The system according to claim 1, the system comprising a sample and hold circuit for sampling and holding the integration signal for obtaining the processed version of the integration signal.

7. The system according to claim 1, the system comprising exactly one integrator.

8. The system according to claim 1, the system comprising exactly two integrators wherein an input signal of the second integrator is the sum of an output signal of the first integrator and an output signal of the second integrator multiplied with a predefined constant $a_1$.

9. The system according to claim 1, wherein the predefined bias voltage is such that the sum obtained by the summator is inside a quadratic region of the transistor circuit characteristic.

10. The system according to claim 1, wherein the predefined bias voltage is such that the sum obtained by the summator is in a linear region of the transistor circuit characteristic.

11. The system according to any of claim 1, wherein in a first stage the predefined bias voltage is such that the sum obtained by the summator is in a linear region of the transistor circuit characteristic and wherein in a second stage the predefined bias voltage is such that the sum obtained by the summator is inside a quadratic region of the transistor circuit characteristic.

12. The system according to claim 1, the system comprising a quantizer configured for quantizing the integrator signal at a predefined sampling frequency, and a digital to analog converter for converting the quantized signal into an analog signal for summing with the toggling signal at the summator.

13. The system according to claim 12 wherein the digital to analog converter is toggling between a first predefined reference voltage for a digital zero input and a second predefined reference voltage for a digital one input wherein the first and second reference voltages and the predefined bias voltage are selected such that toggling with the predefined bias voltage results in a voltage in the left linear region and a voltage in the right linear region of said transistor circuit.

14. The system according to claim 12 wherein the digital to analog converter is toggling between a first predefined reference voltage for a digital zero input and a second predefined reference voltage for a digital one input wherein the first reference voltage and the predefined bias voltage are selected such that toggling with the predefined bias voltage results in a voltage in the left part of a quadratic region and a voltage in the same left part of said quadratic region and wherein the second reference voltage and the predefined bias voltage are selected such that toggling with the predefined bias voltage results in a voltage in the right part of said quadratic region and a voltage in the same right part of said quadratic region of said transistor circuit.

15. The system according to claim 12 wherein the quantizer is a multi-bit quantizer with a predefined number of $N_q$ bits, wherein the digital to analog converter has $N_q$ bits.

* * * * *